(12) United States Patent
Kwak et al.

(10) Patent No.: US 12,520,490 B2
(45) Date of Patent: Jan. 6, 2026

(54) SEMICONDUCTOR DEVICE AND MANUFACTURING METHOD OF SEMICONDUCTOR DEVICE

(71) Applicant: SK hynix Inc., Icheon-si (KR)

(72) Inventors: Rho Gyu Kwak, Icheon-si (KR); Jung Shik Jang, Icheon-si (KR); In Su Park, Icheon-si (KR); Seok Min Choi, Icheon-si (KR); Won Geun Choi, Icheon-si (KR); Jung Dal Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 328 days.

(21) Appl. No.: 18/338,164

(22) Filed: Jun. 20, 2023

(65) Prior Publication Data

US 2024/0268114 A1    Aug. 8, 2024

(30) Foreign Application Priority Data

Feb. 6, 2023    (KR) .......................... 10-2023-0015390

(51) Int. Cl.
  *H10B 43/27*   (2023.01)
  *H10B 41/10*   (2023.01)
  *H10B 41/27*   (2023.01)
  *H10B 43/10*   (2023.01)
(52) U.S. Cl.
  CPC ............. *H10B 43/27* (2023.02); *H10B 41/10* (2023.02); *H10B 41/27* (2023.02); *H10B 43/10* (2023.02)

(58) Field of Classification Search
  CPC ........ H10B 41/27; H10B 43/27; H10B 43/10; H10B 41/10
  See application file for complete search history.

(56) References Cited

U.S. PATENT DOCUMENTS

| 9,166,032 | B1* | 10/2015 | Higuchi | ................. | H10B 43/27 |
| 9,620,514 | B2* | 4/2017 | Kai | ....................... | H10B 41/10 |
| 11,211,400 | B2* | 12/2021 | She | ....................... | H01L 23/528 |
| 11,282,850 | B2 | 3/2022 | Takashima et al. | | |

(Continued)

FOREIGN PATENT DOCUMENTS

KR    1020210032592 A    3/2021

*Primary Examiner* — Evren Seven
(74) *Attorney, Agent, or Firm* — WILLIAM PARK AND ASSOCIATES LTD.

(57) ABSTRACT

A semiconductor device includes a first gate structure including a plurality of first conductive layers and a plurality of first insulating layers that are alternately stacked; an isolation insulating layer located in the first gate structure, the isolation insulating layer including a first line portion extending in a first direction, a plurality of first protrusions protruding from the first line portion towards one side of the first line portion in a second direction, and a plurality of second protrusions protruding from the first line portion towards another side of the first line portion in an opposite direction to the first protrusions, wherein the second direction is orthogonal to the first direction; a plurality of first memory patterns, wherein one of the plurality of first memory patterns surrounds one of the plurality of first protrusions; and a plurality of first passivation patterns, wherein one of the plurality of first passivation patterns is located between the first line portion and one of the plurality of first memory patterns.

12 Claims, 33 Drawing Sheets

(56) References Cited

U.S. PATENT DOCUMENTS

| | | | | |
|---|---|---|---|---|
| 2011/0287612 | A1* | 11/2011 | Lee | H10B 43/10 |
| | | | | 257/E21.09 |
| 2014/0264549 | A1* | 9/2014 | Lee | H10B 41/27 |
| | | | | 438/269 |
| 2018/0097011 | A1* | 4/2018 | Sakata | H10B 43/10 |
| 2019/0067182 | A1* | 2/2019 | Lee | H10D 62/115 |
| 2019/0181152 | A1* | 6/2019 | Choi | H10B 41/10 |
| 2019/0386022 | A1* | 12/2019 | Kim | H10B 43/27 |
| 2022/0093756 | A1* | 3/2022 | Lee | H10D 62/292 |
| 2024/0276722 | A1* | 8/2024 | Choi | H10B 43/27 |
| 2024/0284671 | A1* | 8/2024 | Choi | H10B 41/27 |

* cited by examiner

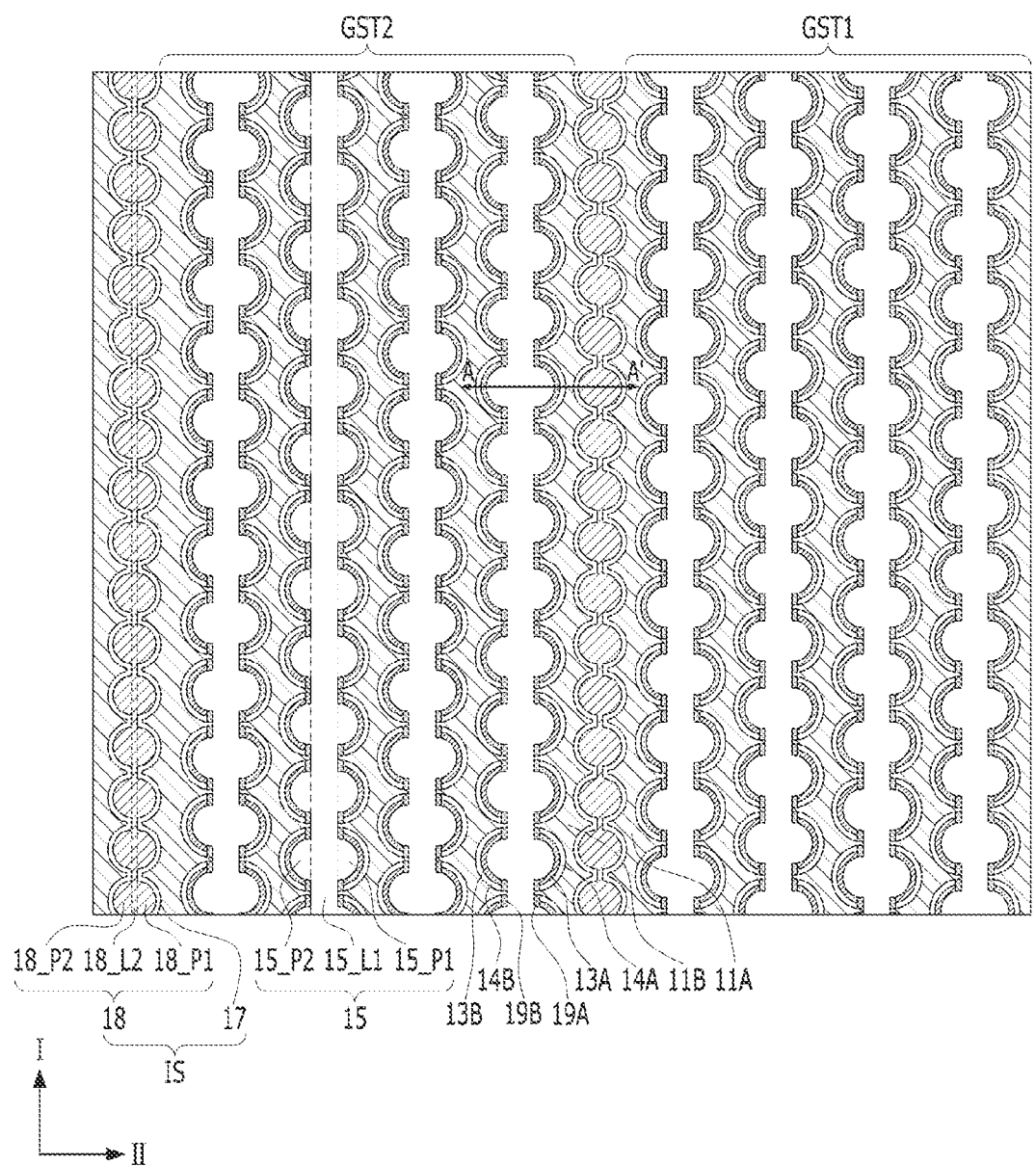

SEMICONDUCTOR DEVICE AND MANUFACTURING METHOD OF SEMICONDUCTOR DEVICE

CROSS-REFERENCE TO RELATED APPLICATION

This application claims priority under 35 U.S.C. § 119(a) to Korean Patent Application No. 10-2023-0015390 filed on Feb. 6, 2023, in the Korean Intellectual Property Office, which is incorporated herein by reference in its entirety.

BACKGROUND

1. Technical Field

Embodiments of the present disclosure relate to an electronic device, and more particularly, to a semiconductor device and a manufacturing method of the semiconductor device.

2. Related Art

The degree of integration of a semiconductor device is mainly determined by an area occupied by a unit memory cell. Recently, as the improvement in the degree of integration of a semiconductor device for forming memory cells in a single layer on a substrate has reached a limit, a three-dimensional semiconductor device for stacking memory cells on a substrate has been proposed. Furthermore, in order to improve the operational reliability of such a semiconductor device, various structures and manufacturing methods have been developed.

SUMMARY

In an embodiment, a semiconductor device may include: a first gate structure including a plurality of first conductive layers and a plurality of first insulating layers that are alternately stacked; an isolation insulating layer located in the first gate structure, the isolation insulating layer including a first line portion extending in a first direction, a plurality of first protrusions protruding from the first line portion in a second direction, and a plurality of second protrusions protruding from the first line portion in an opposite direction to the first protrusions, wherein the second direction intersects the first direction; a plurality of first memory patterns, wherein one of the plurality of first memory patterns surrounds one of the plurality of first protrusions; and a plurality of first passivation patterns, wherein one of the plurality of first passivation patterns is located between the first line portion and one of the plurality of first memory patterns.

In an embodiment, a manufacturing method of a semiconductor device may include: forming a stack including a plurality of first material layers and a plurality of second material layers that are alternately stacked; forming, in the stack, an opening including a plurality of first regions, each having a first width, and a plurality of second regions, each having a second width that is less than the first width; forming, in the opening, a memory layer having different thicknesses in the first region compared to the second region; forming a plurality of memory patterns located in the first regions by etching the memory layer; forming a plurality of passivation patterns on etched surfaces of the plurality of memory patterns; and forming an isolation insulating layer in the opening.

In an embodiment, a manufacturing method of a semiconductor device may include: forming a stack including a plurality of first material layers and a plurality of second material layers that are alternately stacked; forming a plurality of first openings in the stack; forming a second opening connecting the first openings by expanding the first openings; forming a plurality of mutually isolated channel patterns in the second opening; forming a plurality of memory patterns in the second opening, wherein one of the plurality of memory patterns surrounds one of the plurality of channel patterns; forming, in the second opening, a plurality of passivation patterns extending from a side wall of a memory pattern, among the plurality of memory patterns, to a side wall of a channel pattern, among the plurality of channel patterns; and replacing the plurality of first material layers exposed between the plurality of passivation patterns with a plurality of third material layers through the second opening.

BRIEF DESCRIPTION OF THE DRAWINGS

FIG. 1A and FIG. 1B are diagrams illustrating the structure of a semiconductor device in accordance with an embodiment.

DETAILED DESCRIPTION

Various embodiments are directed to a semiconductor device having a stable structure and improved characteristics and a manufacturing method of the semiconductor device.

By stacking memory cells in three dimensions, it is possible to improve the degree of integration of a semiconductor device. It is also possible to provide a semiconductor device having a stable structure and improved reliability.

Hereafter, embodiments in accordance with the technical spirit of the present disclosure will be described with reference to the accompanying drawings.

Figure 1B:
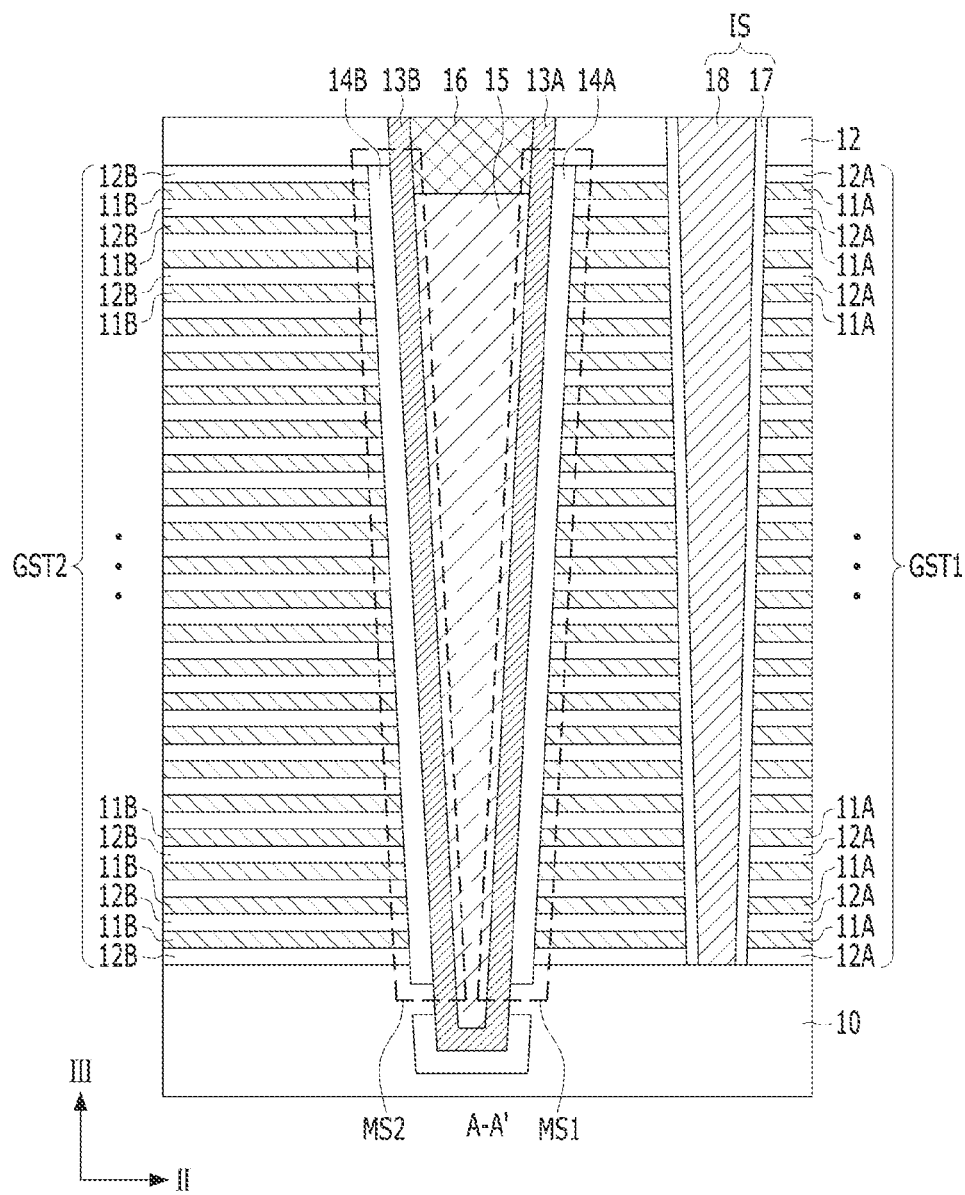

FIG. 1A and FIG. 1B are diagrams illustrating the structure of a semiconductor device in accordance with an embodiment. FIG. 1A may be a plan view and FIG. 1B may be a cross-sectional view taken along line A-A' in FIG. 1A.

Referring to FIG. 1A and FIG. 1B, the semiconductor device may include a first gate structure GST1, an isolation insulating layer 15, first memory patterns 14A, and first passivation patterns 19A, or a combination thereof. The semiconductor device may further include a second gate structure GST2, first channel patterns 13A, second channel patterns 13B, second memory patterns 14B, second passivation patterns 19B, a source structure 10, a pad pattern 16, an isolation structure IS, and an insulating layer 12, or a combination thereof.

The first gate structure GST1 may include first conductive layers 11A and first insulating layers 12A that are alternately stacked. The first conductive layers 11A may be gate lines, such as word lines, selection lines, and bit lines. The first conductive layers 11A may each include a conductive material, such as polysilicon, tungsten (W), or molybdenum (Mo). The first insulating layers 12A may be used to insulate the stacked gate lines from each other and may each include an insulating material, such as oxide, nitride, or air gap.

The isolation insulating layer 15 may be located in the first gate structure GST1. The isolation insulating layer 15 may extend in a first direction I. The isolation insulating layer 15 may include a first line portion 15_L1, at least one first protrusion 15_P1, and at least one second protrusion 15_P2. The first line portion 15_L1 may extend in the first direction I. The first protrusion 15_P1 may protrude from the first line portion 15_L1 towards one side, and the second protrusion 15_P2 may protrude from the first line portion 15_L1 to another side in the opposite direction to the first protrusion 15_P1. For example, the first protrusion 15_P1 may protrude in a second direction II and the second protrusion 15_P2 may protrude in opposite direction of the second direction II (i.e., the negative second direction). The second direction II may intersect the first direction I. The second direction may be orthogonal to the first direction. The first protrusion 15_P1 and the second protrusion 15_P2 may be symmetrically or asymmetrically arranged in relation to the first line portion 15_L1.

The first channel patterns 13A may surround the first protrusions 15_P1, respectively. One of the first channel patterns 13A may surround one of the first protrusions 15_P1. The first channel patterns 13A may each include a semiconductor material, such as silicon (Si) or germanium (Ge). The first memory patterns 14A may surround the first protrusions 15_P1, respectively. One of the first memory patterns 14A may surround one of the first protrusions 15_P1. The first memory patterns 14A may each include a floating gate, polysilicon, a charge trap material, nitride, a variable resistance material, or the like, or a combination thereof. Each of the first channel patterns 13A may be located between the first protrusion 15_P1 and the first memory pattern 14A.

The second channel patterns 13B may surround the second protrusions 15_P2, respectively. One of the second channel patterns 13B may surround one of the second protrusions 15_P2. The second channel patterns 13B each include a semiconductor material, such as silicon (Si) or germanium (Ge). The second memory patterns 14B may surround the second protrusions 15_P2, respectively. One of the second memory patterns 14B may surround one of the second protrusions 15_P2. The second memory patterns 14B may each include a floating gate, polysilicon, a charge trap material, nitride, a variable resistance material, or the like, or a combination thereof. Each of the second channel patterns 13B may be located between the second protrusion 15_P2 and the second memory pattern 14B.

The pad pattern 16 may be located on the isolation insulating layer 15. The pad pattern 16 may be connected in common to the first channel pattern 13A and the second channel pattern 13B facing each other in the second direction II. As an example, the pad pattern 16 may include polysilicon.

Each of the first passivation patterns 19A may be located between the first line portion 15_L1 and the first memory pattern 14A. The first passivation patterns 19A may be used to protect the first memory patterns 14A during a manufacturing process and may each include oxide, polysilicon, or the like. Each of the first passivation patterns 19A may extend between the first channel pattern 13A and the first line portion 15_L1. Each of the first conductive layers 11A may protrude between the first memory patterns 14A and may extend between the first passivation patterns 19A. One of the first conductive layers 11A may protrude between the first memory patterns 14A and may extend between the first passivation patterns 19A.

Each of the second passivation patterns 19B may be located between the first line portion 15_L1 and the second memory pattern 14B. The second passivation patterns 19B may be used to protect the second memory patterns 14B during the manufacturing process and may each include oxide, polysilicon, or the like. Each of the second passivation patterns 19B may extend between the second channel pattern 13B and the first line portion 15_L1. Each of the first conductive layers 11A may protrude between the second memory patterns 14B and may extend between the second passivation patterns 19B. One of the first conductive layers 11A may protrude between the second memory patterns 14B and may extend between the second passivation patterns 19B.

The second gate structure GST2 may include second conductive layers 11B and second insulating layers 12B that are alternately stacked. The second conductive layers 11B may be gate lines, such as word lines, selection lines, and bit lines. The second conductive layers 11B may each include a conductive material, such as polysilicon, tungsten (W), or molybdenum (Mo). The second insulating layers 12B may be used to insulate the stacked gate lines from each other and may each include an insulating material, such as oxide, nitride, or air gap.

The source structure 10 may be located under the first gate structure GST1 and the second gate structure GST2 and may be connected to the first channel pattern 13A and the second channel pattern 13B. As an example, the source structure 10 may be connected to the first channel pattern 13A by passing through the first memory pattern 14A. The source structure 10 may be connected to the second channel pattern 13B by passing through the second memory pattern 14B. The source structure 10 may include a conductive material, such as polysilicon, tungsten (W), or molybdenum (Mo). The source structure 10 may include a single layer or a multilayer.

The isolation structure IS may be located between the first gate structure GST1 and the second gate structure GST2. The isolation structure IS may pass through the insulating layer 12 and may extend in a third direction III in a cross section defined by the second direction II and the third direction III. The third direction III may be a direction orthogonal to a plane defined by the first direction I and the second direction II. The first gate structure GST1 and the second gate structure GST2 may be isolated from each other by the isolation structure IS.

The isolation structure IS may include a source contact structure 18 and an insulating spacer 17. The source contact structure 18 may be electrically connected to the source structure 10. The insulating spacer 17 may be used to insulate the source contact structure 18 from the first conductive layers 11A and the second conductive layers 11B and may include an insulating material, such as oxide or nitride.

The source contact structure 18 may include a second line portion 18_L2, at least one first protrusion 18_P1, and at least one second protrusion 18_P2. In the plane, the second line portion 18_L2 may extend in the first direction I. The first protrusion 18_P1 may protrude from the second line portion 18_L2 towards one side, and the second protrusion 18_P2 may protrude from the second line portion 18_L2 towards the other side in the opposite direction to the first protrusion 18_P1. For example, the first protrusion 18_P1 may protrude in the second direction II and the second protrusion 18_P2 may protrude in opposite direction of the second direction II (i.e., the negative second direction), respectively. The first protrusion 18_P1 and the second protrusion 18_P2 may be symmetrically or asymmetrically arranged in relation to the second line portion 18_L2. The source contact structure 18 may be a dummy channel layer, and the insulating spacer 17 may be a dummy memory layer.

According to the structure described above, a first memory cell, a first source select transistor, or a first drain select transistor may be located in a region in which the first channel pattern 13A and the first conductive layers 11A intersect each other. At least one first source select transistor, a plurality of first memory cells, and at least one first drain select transistor sharing the first channel pattern 13A may constitute a first memory string MS1.

A second memory cell, a second source select transistor, or a second drain select transistor may be located in a region in which the second channel pattern 13B and the second conductive layers 11B intersect each other. At least one second source select transistor, a plurality of second memory cells, and at least one second drain select transistor sharing the second channel pattern 13B may constitute a second memory string MS2.

The first memory string MS1 and the second memory string MS2 may be isolated from each other by the isolation insulating layer 15. The first memory string MS1 and the second memory string MS2 may be individually driven.

Figure 2A:
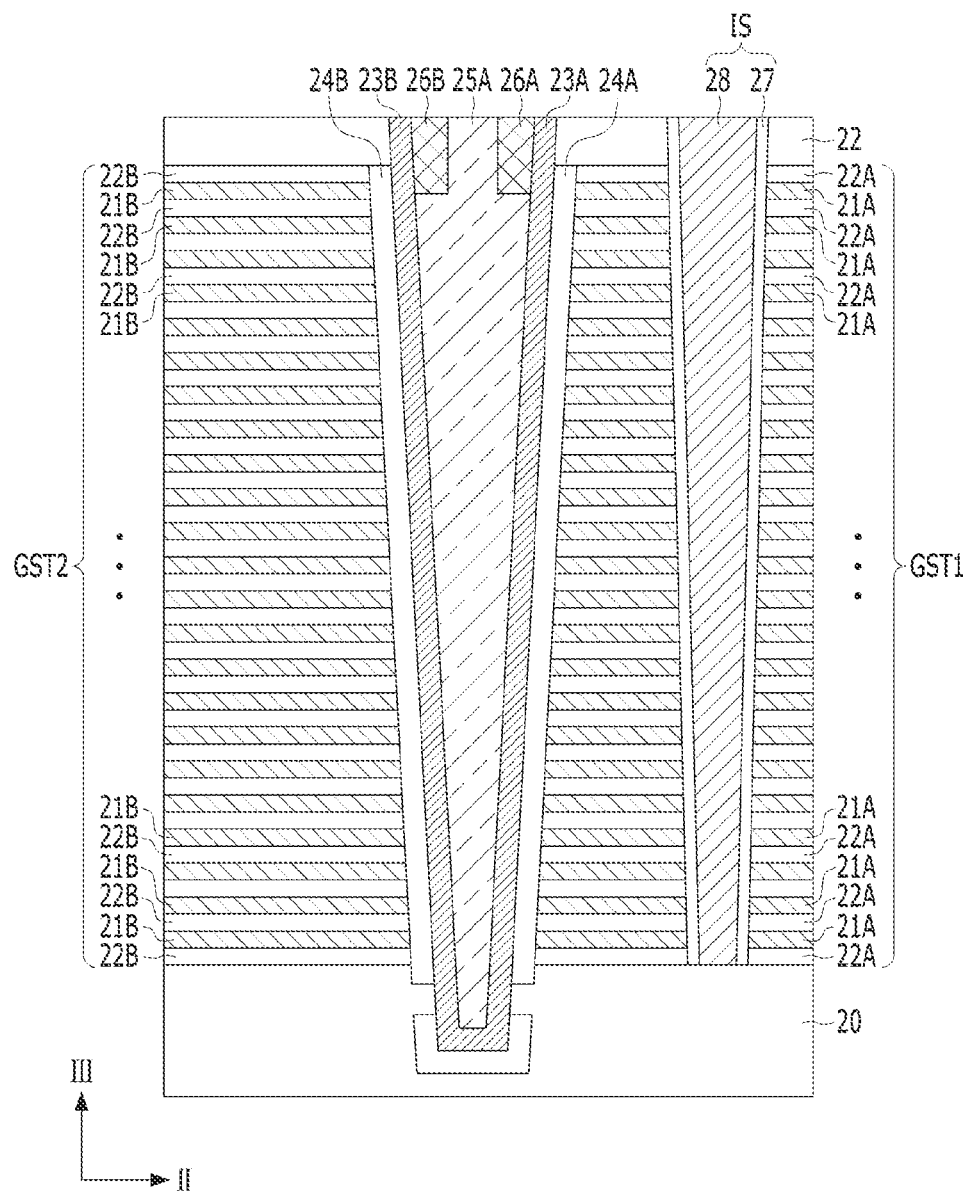
FIG. 2A to FIG. 2C are diagrams illustrating the structure of a semiconductor device in accordance with an embodiment.
Figure 2B:
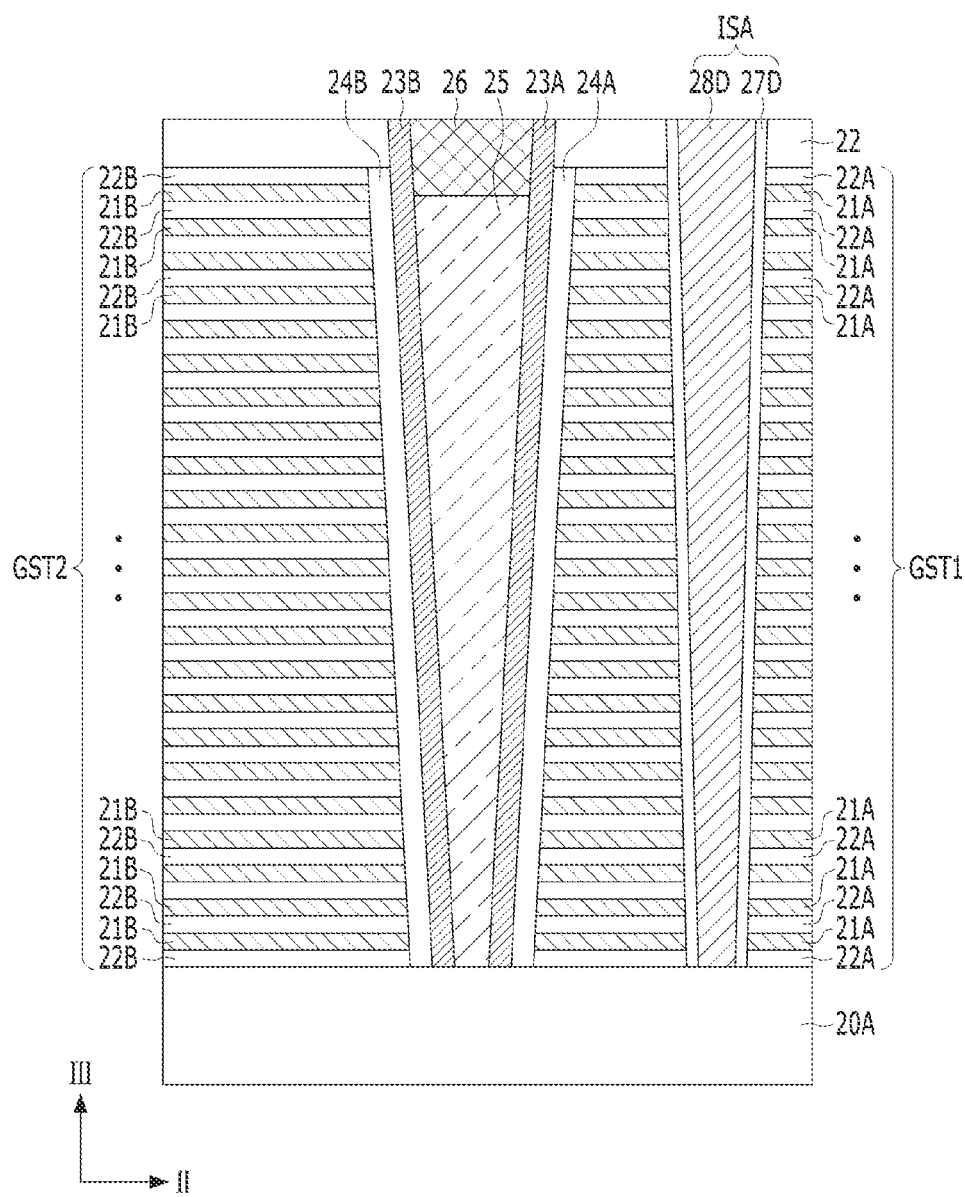
Figure 2C:
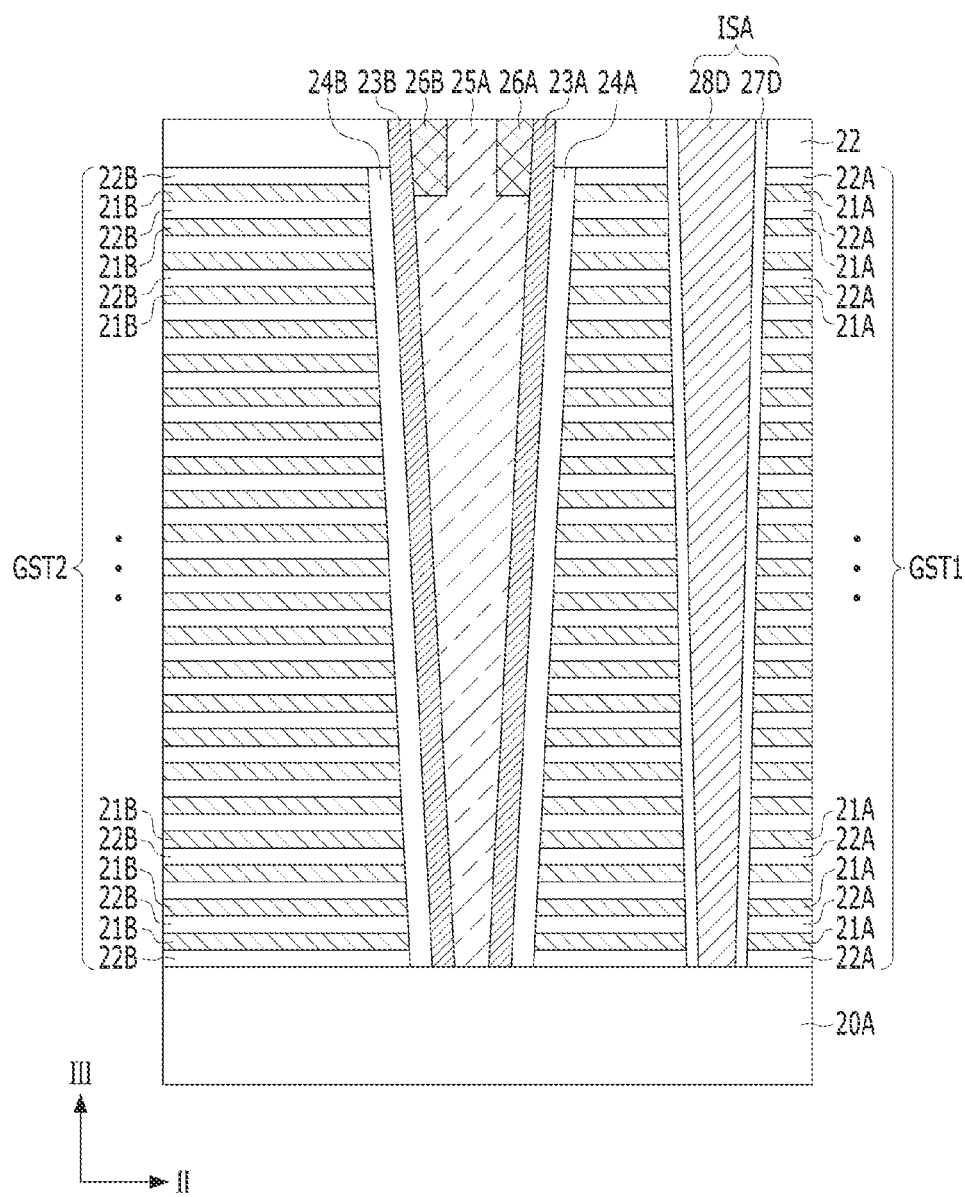

FIG. 2A to FIG. 2C are diagrams illustrating the structure of a semiconductor device in accordance with an embodiment. Hereinafter, the content overlapping with the previously described content will be omitted.

Referring to FIG. 2A, the semiconductor device may include a first gate structure GST1, an isolation insulating layer 25A, and first memory patterns 24A, or a combination thereof. The semiconductor device may further include a second gate structure GST2, first channel patterns 23A, second channel patterns 23B, second memory patterns 24B, a source structure 20, and a first pad pattern 26A, a second pad pattern 26B, an isolation structure IS, and an insulating layer 22, or a combination thereof. The isolation structure IS may include a source contact structure 28 and an insulating spacer 27.

The first gate structure GST1 may include first conductive layers 21A and first insulating layers 22A that are alternately stacked. The second gate structure GST2 may include second conductive layers 21B and second insulating layers 22B that are alternately stacked.

The first pad pattern 26A and the second pad pattern 26B may be located on the isolation insulating layer 25A. The first pad pattern 26A and the second pad pattern 26B may be face each other in the second direction II, and the isolation insulating layer 25A may extend between the first pad pattern 26A and the second pad pattern 26B. The first pad pattern 26A may be connected to the first channel pattern 23A and may be isolated from the second channel pattern 23B. The second pad pattern 26B may be connected to the second channel pattern 23B and may be isolated from the first channel pattern 23A. As an example, the first pad pattern 26A and the second pad pattern 26B may each include polysilicon.

Referring to FIG. 2B, the semiconductor device may include the first gate structure GST1, an isolation insulating layer 25, and the first memory patterns 24A, or a combination tion thereof. The semiconductor device may further include the second gate structure GST2, the first channel patterns 23A, the second channel patterns 23B, the second memory patterns 24B, a source structure 20A, a pad pattern 26, and an isolation structure ISA, or a combination thereof.

The isolation structure ISA may include a dummy channel layer 28D and a dummy memory layer 27D. The dummy channel layer 28D may be electrically connected to the source structure 20A. The dummy memory layer 27D may be used to insulate the dummy channel layer 28D from the first conductive layers 21A and the second conductive layers 21B and may include an insulating material, such as oxide or nitride.

The semiconductor device may have a structure in which a cell chip including a memory cell array and a peripheral circuit chip including a peripheral circuit are bonded to each other. The first gate structure GST1 and the second gate structure GST2 may be included in the cell chip. The cell chip may be reversed so that the pad pattern 26 is located below and may be bonded to the peripheral circuit chip. The source structure 20A may be formed after the cell chip and the peripheral circuit chip are bonded to each other.

Referring to FIG. 2C, the semiconductor device may include the first gate structure GST1, the isolation insulating layer 25A, and the first memory patterns 24A, or a combination thereof. The semiconductor device may further include the second gate structure GST2, the first channel patterns 23A, the second channel patterns 23B, the second memory patterns 24B, the source structure 20A, the first pad pattern 26A, the second pad pattern 26B, and the isolation structure IS, or a combination thereof.

According to the structure described above, one pad pattern 26 may be connected in common to the first channel pattern 23A and the second channel pattern 23B, or the first and second pad patterns 26A and 26B may be connected to the first and second channel patterns 23A and 23B, respectively. The isolation structure IS may include the source contact structure 28 and the insulating spacer 27, or the isolation structure ISA may include the dummy memory layer 27D and the dummy channel layer 28D.

Figure 3:
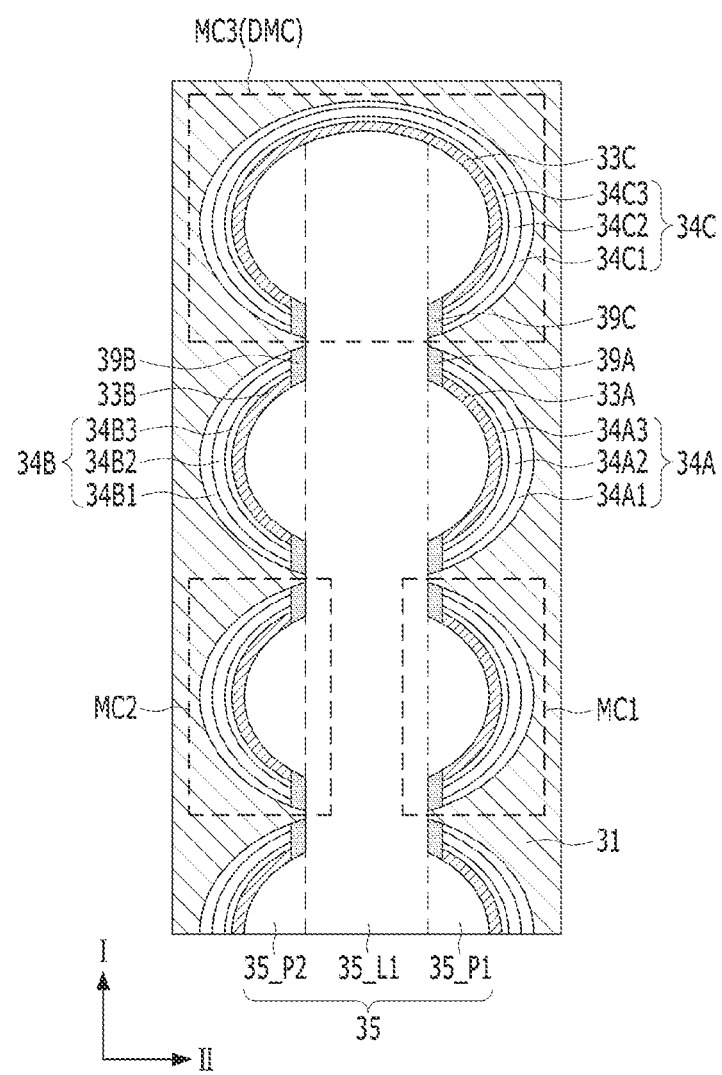
FIG. 3 is a diagram illustrating the structure of a semiconductor device in accordance with an embodiment.

FIG. 3 is a diagram illustrating the structure of a semiconductor device in accordance with an embodiment. Hereinafter, the content overlapping with the previously described content will be omitted.

Referring to FIG. 3, the semiconductor device may include a first memory cell MC1 and a second memory cell MC2. The semiconductor device may further include a third memory cell MC3, an isolation insulating layer 35, a first passivation pattern 39A, a second passivation pattern 39B, and a third passivation pattern 39C, or a combination thereof.

The first memory cells MC1 may be located to correspond to first protrusions 35_P1. The first memory cells MC1 may be located on one side of the isolation insulating layer 35 and may be arranged along the first direction I. The second memory cells MC2 may be located on the other side of the isolation insulating layer 35 and may be arranged along the first direction I. The first memory cell MC1 and the second memory cell MC2 may be located adjacent to each other in the second direction II with the isolation insulating layer 35 interposed therebetween.

The first memory cell MC1 may include a first channel pattern 33A and a first memory pattern 34A. A portion of the first conductive layer 31 surrounding the first memory pattern 34A may be used as a first gate electrode of the first memory cell MC1. The first memory pattern 34A may include a blocking layer 34A1, a data storage layer 34A2, and a tunneling layer 34A3, or a combination thereof. The data storage layer 34A2 may include a floating gate, polysilicon, a charge trap material, nitride, a variable resistance material, or the like, or a combination thereof.

The first passivation pattern 39A may be located between the first memory pattern 34A and the isolation insulating layer 35. The first passivation pattern 39A may extend between the first channel pattern 33A and the isolation insulating layer 35. The first passivation pattern 39A may also extend along an inner surface of the first channel pattern 33A. As an example, the first passivation pattern 39A may extend between the first protrusion 35_P1 of the isolation insulating layer 35 and the first channel pattern 33A.

The second memory cells MC2 may be located to correspond to second protrusions 35_P2. The second memory cell MC2 may include a second channel pattern 33B and a second memory pattern 34B. A portion of the first conductive layer 31 surrounding the second memory pattern 34B may be used as a second gate electrode of the second memory cell MC2. The second memory pattern 34B may include a blocking layer 34B1, a data storage layer 34B2, and a tunneling layer 34B3, or a combination thereof. The data storage layer 34B2 may include a floating gate, polysilicon, a charge trap material, nitride, a variable resistance material, or the like, or a combination thereof.

The second passivation pattern 39B may be located between the second memory pattern 34B and the isolation insulating layer 35. The second passivation pattern 39B may extend between the second channel pattern 33B and the isolation insulating layer 35. The second passivation pattern 39B may also extend along an inner surface of the second channel pattern 33B. As an example, the second passivation pattern 39B may extend between the second protrusion 35_P2 of the isolation insulating layer 35 and the second channel pattern 33B.

The third memory cell MC3 may be located at an end portion of the isolation insulating layer 35. The third memory cell MC3 may be a real memory cell storing data or a dummy memory cell DMC. The third memory cell MC3 may include a third channel pattern 33C and a third memory pattern 34C. A portion of the first conductive layer 31 surrounding the third memory pattern 34C may be used as a third gate electrode of the third memory cell MC3. The third memory pattern 34C may include a blocking layer 34C1, a data storage layer 34C2, and a tunneling layer 34C3, or a combination thereof. The data storage layer 34C2 may include a floating gate, polysilicon, a charge trap material, nitride, a variable resistance material, or the like, or a combination thereof.

The third memory pattern 34C may surround an end portion of a first line portion 35_L1 and may extend to surround the first protrusion 35_P1 and the second protrusion 35_P2 adjacent to the end portion. As an example, the third memory pattern 34C may surround the end portion of the first line portion 35_L1 and the first protrusion 35_P1, surround the end portion of the first line portion 35_L1 and the second protrusion 35_P2, or surround the end portion of the first line portion 35_L1, the first protrusion 35_P1, and the second protrusion 35_P2. The third channel pattern 33C may be located between the isolation insulating layer 35 and the third memory pattern 34C. For example, the third channel pattern 33C may be located between the first line portion 35_L1 and the third memory pattern 34C, and the third channel pattern 33C may extend between the third memory pattern 34C and the first protrusion 35_P1 or may extend between the third memory pattern 34C and the second protrusion 35_P2.

The third passivation pattern 39C may be located between the third memory pattern 34C and the isolation insulating layer 35. The third passivation pattern 39C may extend between the third channel pattern 33C and the isolation insulating layer 35. The third passivation pattern 39C may also extend along an inner surface of the third channel pattern 33C. As an example, the third passivation pattern 39C may extend between the first protrusion 35_P1 and the third channel pattern 33C or may extend between the second protrusion 35_P2 and the third channel pattern 33C.

According to the structure described above, the first memory cell MC1 and the second memory cell MC2 may be isolated from each other by the isolation insulation layer 35. Accordingly, the first memory cell MC1 and the second memory cell MC2 can be individually driven, and the degree of integration of the semiconductor device can be improved.

Figure 4:
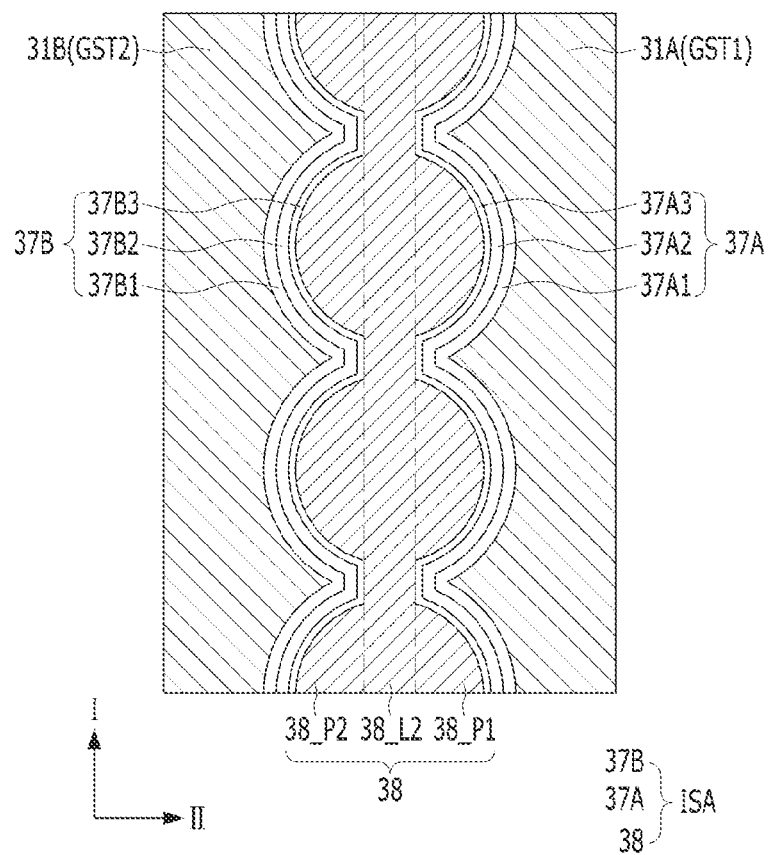
FIG. 4 is a diagram illustrating the structure of a semiconductor device in accordance with an embodiment.

FIG. 4 is a diagram illustrating the structure of a semiconductor device in accordance with an embodiment. Hereinafter, the content overlapping with the previously described content will be omitted.

Referring to FIG. 4, the semiconductor device may include an isolation structure ISA. The isolation structure ISA may be located between a first gate structure GST1 and a second gate structure GST2. The first gate structure GST1 and the second gate structure GST2 may be adjacent to each other in the second direction II, and the isolation structure ISA may extend in the first direction I.

The isolation structure ISA may include a dummy channel layer 38 and dummy memory layers 37A and 37B. The dummy channel layer 38 may include a second line portion 38_L2, a first protrusion 38_P1, and a second protrusion 38_P2. The second line portion 38_L2 may be located between the first gate structure GST1 and the second gate structure GST2. The first protrusion 38_P1 may protrude from the second line portion 38_L2 into the first gate structure GST1. The second protrusion 38_P2 may protrude from the second line portion 38_L2 into the second gate structure GST2. The dummy channel layer 38 may include substantially the same material as channel patterns. The dummy channel layer 38 may include a semiconductor material, such as polysilicon.

The dummy memory layers 37A and 37B may surround the dummy channel layer 38. The dummy memory layers 37A and 37B may include a first dummy memory pattern 37A and a second dummy memory pattern 37B. The first dummy memory pattern 37A and the second dummy memory pattern 37B may be isolated from each other or connected to each other. The first dummy memory pattern 37A may be located between the dummy channel layer 38 and the first gate structure GST1. The second dummy memory pattern 37B may be located between the dummy channel layer 38 and the second gate structure GST2.

The first dummy memory pattern 37A and the second dummy memory pattern 37B may include substantially the same material as memory patterns. The first dummy memory pattern 37A may include a blocking layer 37A1, a data storage layer 37A2, and a tunneling layer 37A3, or a combination thereof. The second dummy memory pattern 37B may include a blocking layer 37B1, a data storage layer 37B2, and a tunneling layer 37B3, or a combination thereof. The data storage layers 37A2 and 37B2 may each include a floating gate, polysilicon, a charge trap material, nitride, a variable resistance material, or the like, or a combination thereof.

According to the structure described above, the isolation structure ISA may isolate the first gate structure GST1 and the second gate structure GST2 from each other. First conductive layers 31A of the first gate structure GST1 and first conductive layers 31B of the second gate structure GST2 may be insulated from each other by the isolation structure ISA. The isolation structure ISA may be formed together when the channel pattern and the memory pattern are formed.

FIG. 5A to FIG. 5C, FIG. 6A to FIG. 6C, FIG. 7A to FIG. 7C, FIG. 8A to FIG. 8C, FIG. 9A to FIG. 9C, FIG. 10A to FIG. 10C, and FIG. 11A to FIG. 11C are diagrams for describing a manufacturing method of a semiconductor device in accordance with an embodiment. FIG. 5A, FIG. 6A, FIG. 7A, FIG. 8A, FIG. 9A, FIG. 10A, and FIG. 11A may be plan views, respectively, FIG. 5B, FIG. 6B, FIG. 7B, FIG. 8B, FIG. 9B, FIG. 10B, and FIG. 11B may be cross-sectional views taken along lines B-B' of FIG. 5A, FIG. 6A, FIG. 7A, FIG. 8A, FIG. 9A, FIG. 10A, and FIG. 11A, respectively, and FIG. 5C, FIG. 6C, FIG. 7C, FIG. 8C, FIG. 9C, FIG. 10C, and FIG. 11C may be cross-sectional views taken along lines C-C' of FIG. 5A, FIG. 6A, FIG. 7A, FIG. 8A, FIG. 9A, FIG. 10A, and FIG. 11A, respectively. Hereinafter, the content overlapping with the previously described content will be omitted.

Figure 5A:
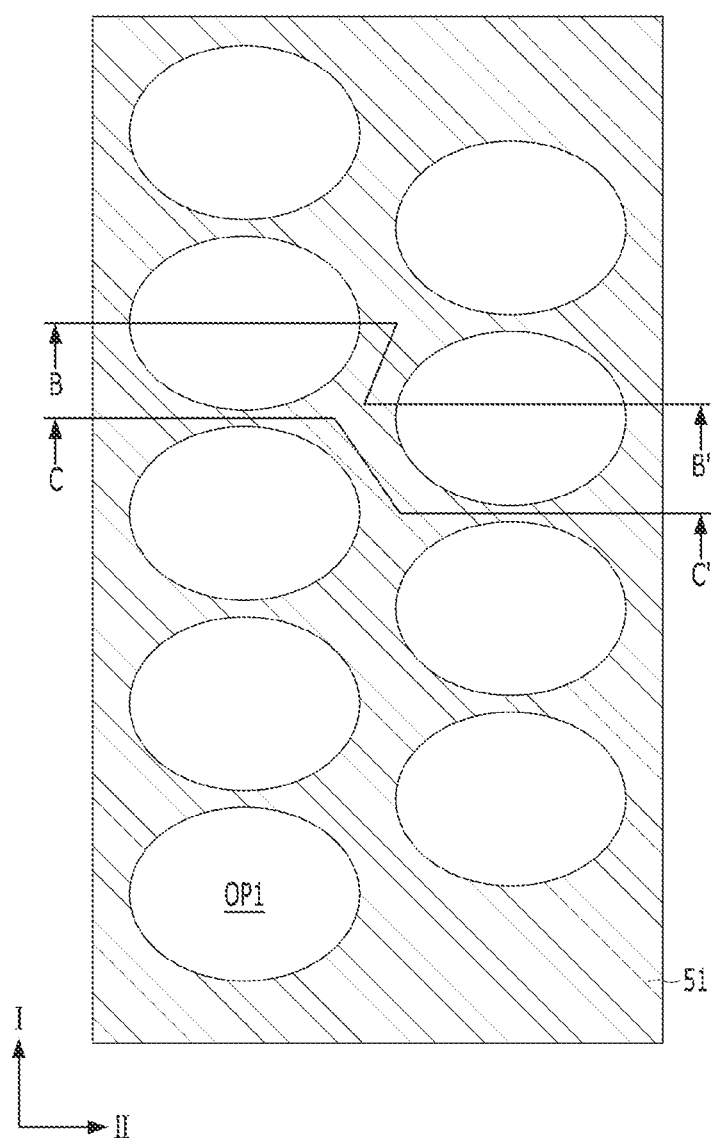
FIG. 5A to FIG. 5C, FIG. 6A to FIG. 6C, FIG. 7A to FIG. 7C, FIG. 8A to FIG. 8C, FIG. 9A to FIG. 9C, FIG. 10A to FIG. 10C, and FIG. 11A to FIG. 11C are diagrams for describing a manufacturing method of a semiconductor device in accordance with an embodiment.
Figure 5B:
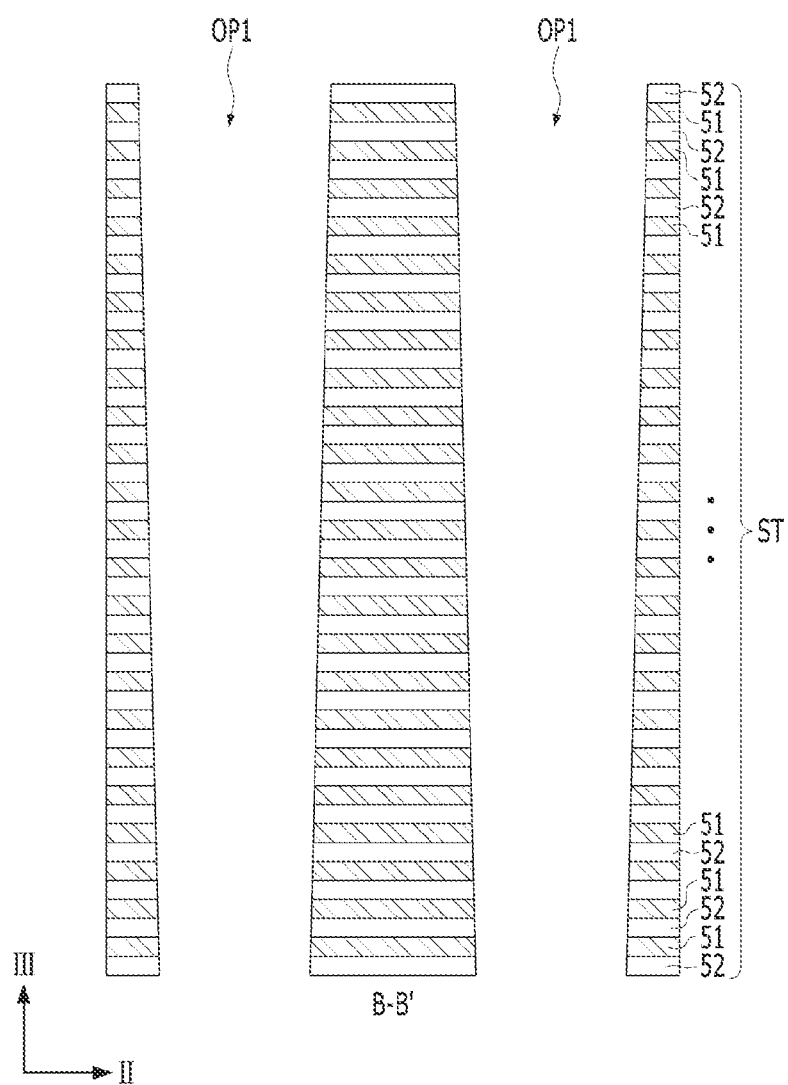
Figure 5C:
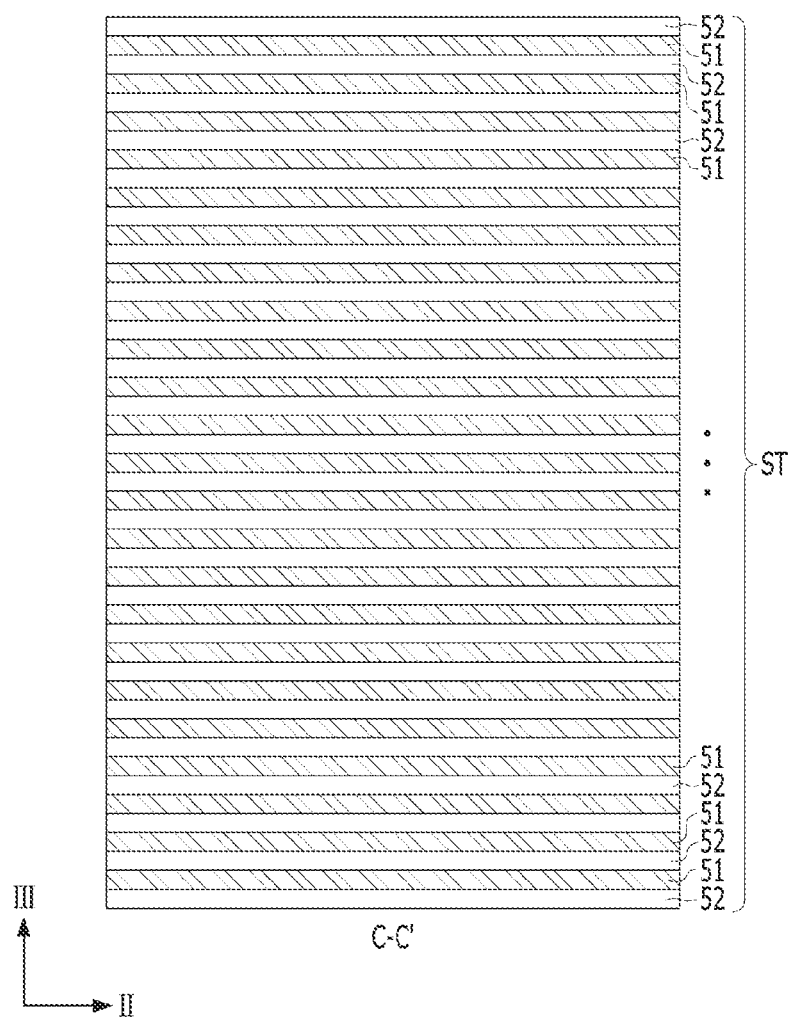

Referring to FIG. 5A to FIG. 5C, a stack ST may be formed. The stack ST may include first material layers 51 and second material layers 52 that are alternately stacked. The first material layers 51 may be used to form a gate line, and the second material layers 52 may be used to form an insulating layer. The first material layers 51 may each include a material having a high etching selectivity with respect to the second material layers 52. For example, the first material layers 51 may each include a sacrificial material, such as nitride, and the second material layers 52 may each include an insulating material, such as oxide. For another example, the first material layers 51 may each include a conductive material, such as polysilicon or metal, and the second material layers 52 may each include an insulating material, such as an oxide.

Subsequently, first openings OP1 may be formed in the stack ST. In a plane defined by the first direction I and the second direction II, the first openings OP1 may be arranged in the first direction I, the second direction II, or the first direction I and the second direction II. The first openings OP1 may be arranged in a staggered shape so that their centers are offset. The first openings OP1 may be spaced apart from each other.

In the plane, the first openings OP1 may have a circular shape, an elliptical shape, a polygonal shape, or the like. As an example, the first opening OP1 may have an elliptical shape including a short axis in the first direction I and a long axis in the second direction II. In a cross section defined by the first direction I and the third direction III, the first openings OP1 may extend in the third direction III through the stack ST.

Figure 6A:
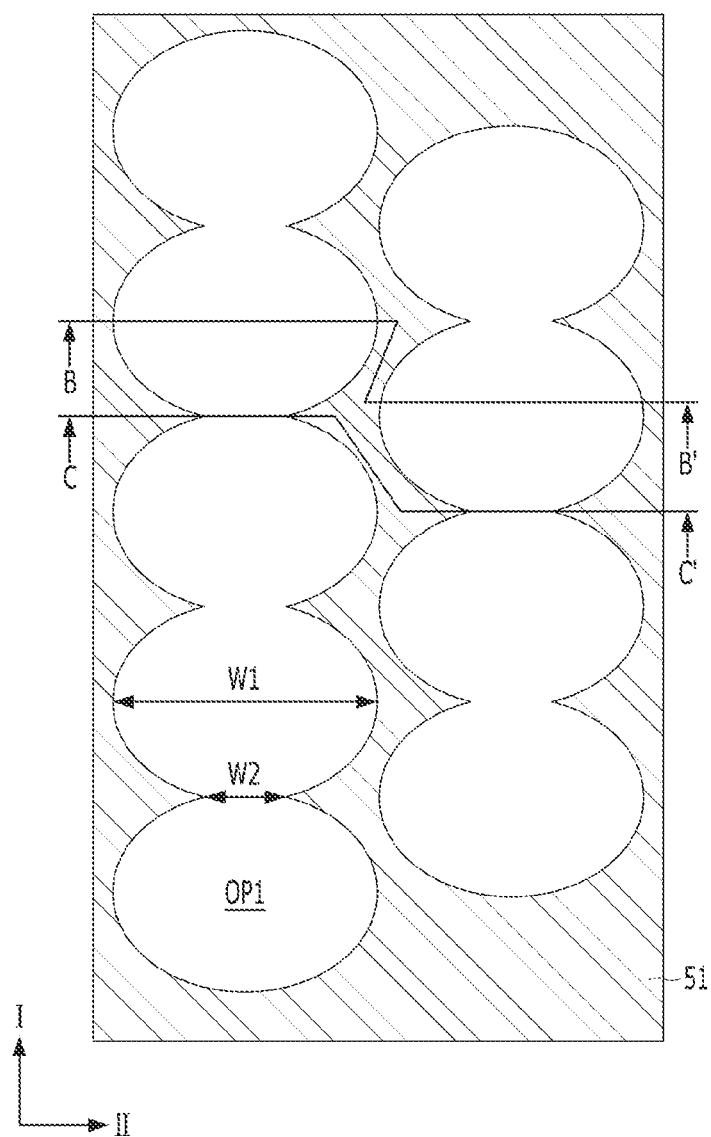
Figure 6B:
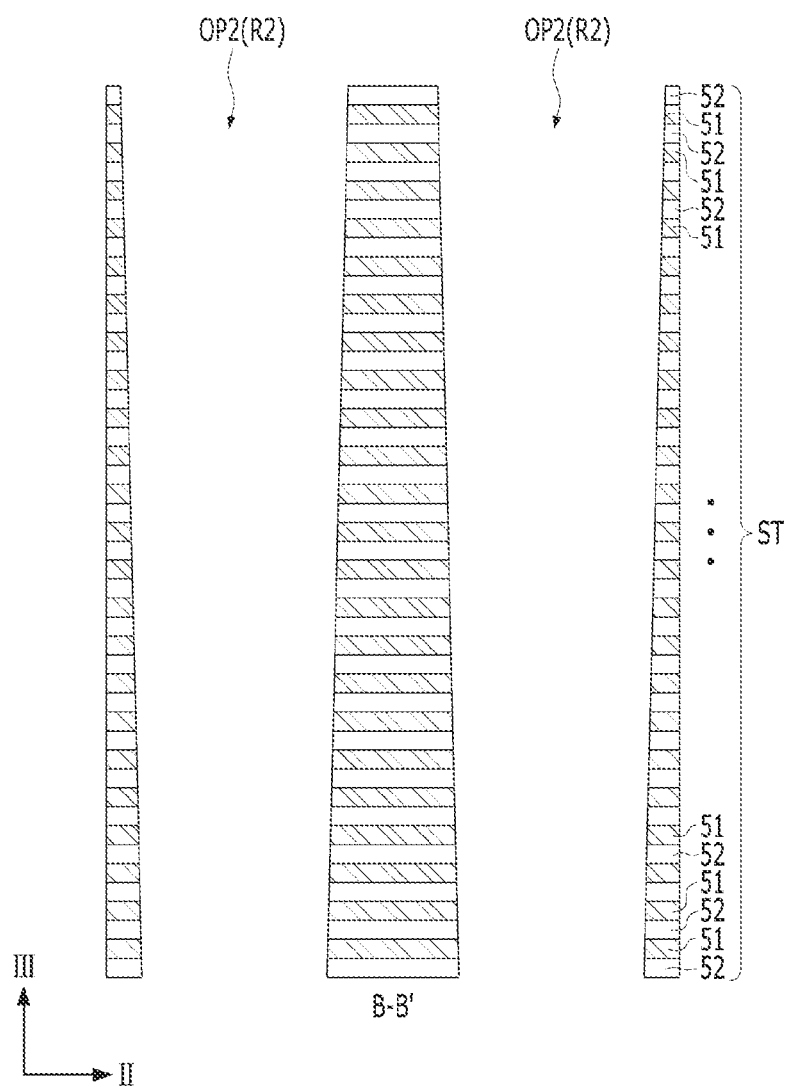
Figure 6C:
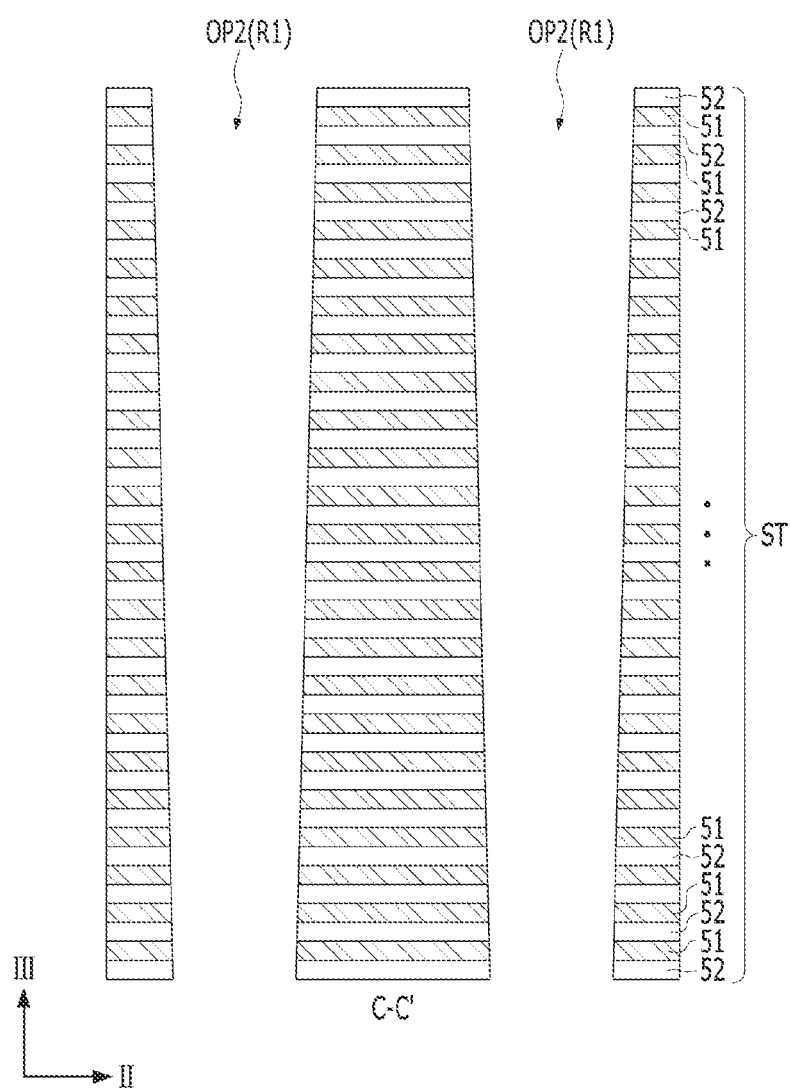

Referring to FIG. 6A to FIG. 6C, a second opening OP2 may be formed. The first openings OP1 may be expanded to form the second opening OP2 connecting the first openings OP1 to each other. As an example, the first openings OP1 may be expanded by wet-etching the first material layers 51 and the second material layers 52 exposed through the first openings OP1. Through this, the first openings OP1 adjacent to each other in the first direction I may be connected to each other.

The second opening OP2 may include first regions R1, each having a first width W1, and second regions R2, each having a second width W2 that is less than the first width W1. The first regions R1 and the second regions R2 may be alternately arranged along the first direction I. Instead of forming and expanding the first openings OP1, the second opening OP2 may also be directly formed in the stack ST.

Figure 7A:
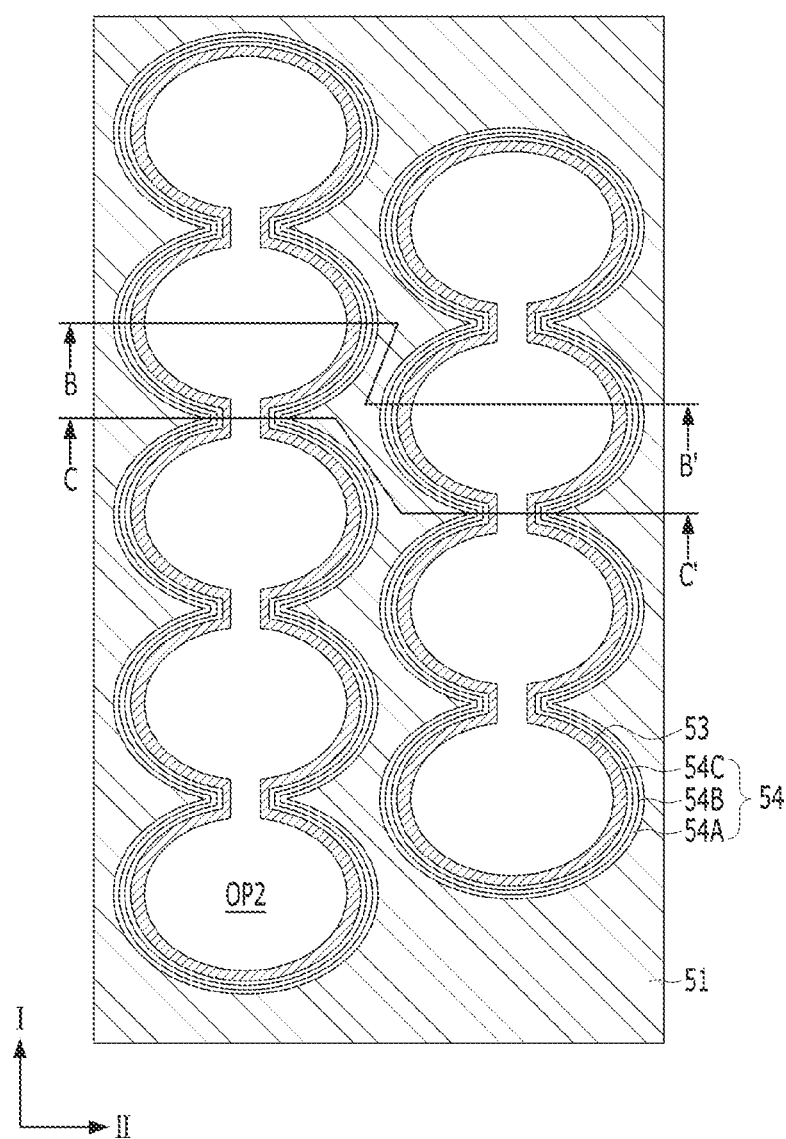
Figure 7B:
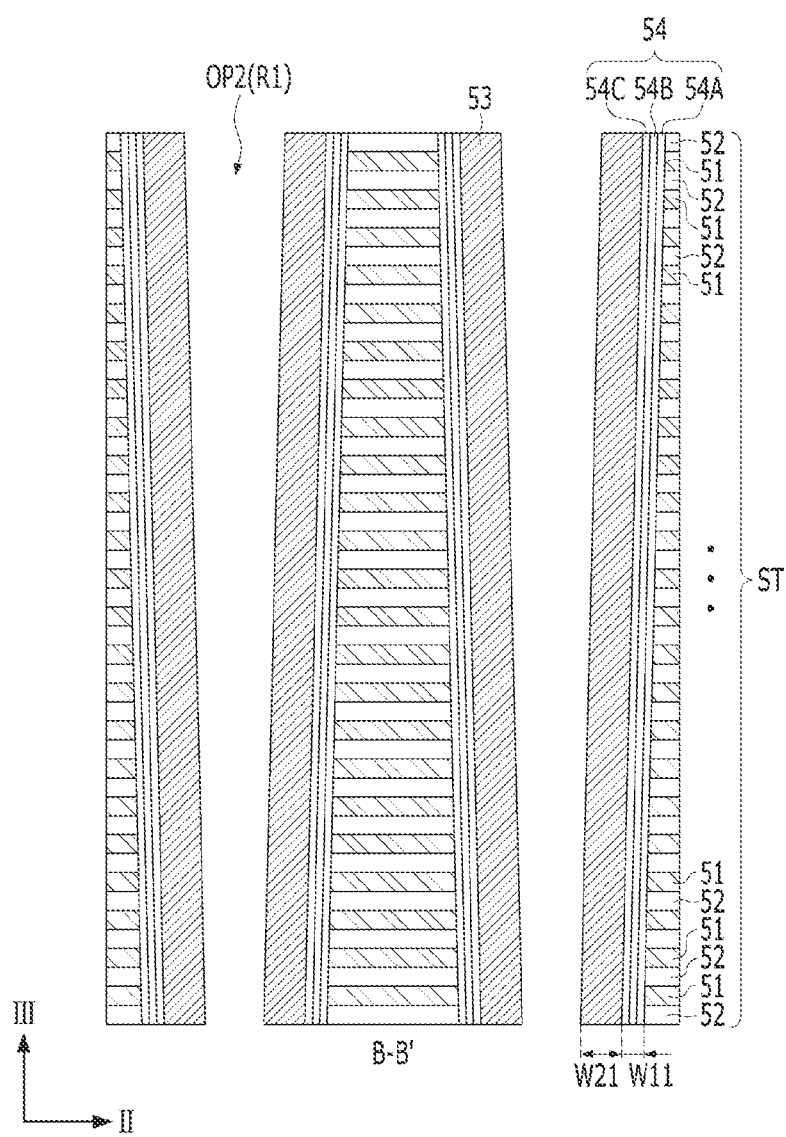
Figure 7C:
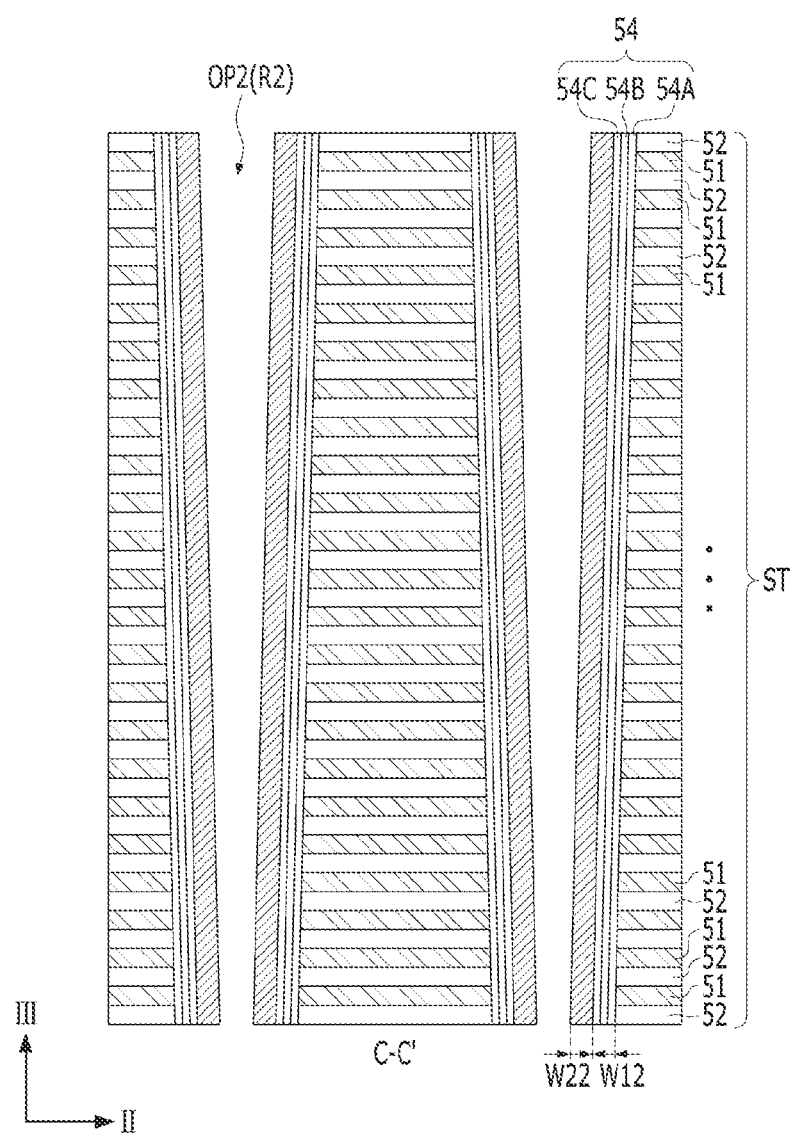

Referring to FIG. 7A to FIG. 7C, a memory layer 54 may be formed in the second opening OP2. As an example, a blocking layer 54A may be formed in the second opening OP2, a data storage layer 54B may be formed in the blocking layer 54A, and a tunneling layer 54C may be formed in the data storage layer 54B.

The memory layer 54 may have varying thicknesses. The memory layer 54 may have different thicknesses in the first region R1 and the second region R2. As an example, the memory layer 54 may have a first thickness W11 in the first region R1 and may have a second thickness W12 that is less than the first thickness W11 in the second region R2. A difference in thickness between the first region R1 and the second region R2 may be caused by the characteristics of a deposition process. The memory layer 54 may be deposited with a relatively great thickness in the first region R1 having a relatively wide open area. The memory layer 54 may be deposited with a relatively small thickness in the second region R2 having a relatively narrow open area and a protruding shape.

A channel layer 53 may be formed in the second opening OP2. As an example, the channel layer 53 may be formed in the memory layer 54. The channel layer 53 may have varying thicknesses. The channel layer 53 may have different thicknesses in the first region R1 and the second region R2. As an example, the channel layer 53 may have a first thickness W21 in the first region R1 and may have a second thickness W22 that is less than the first thickness W21 in the second region R2. A difference in thickness between the first region R1 and the second region R2 may be caused by the characteristics of the deposition process.

Figure 8A:
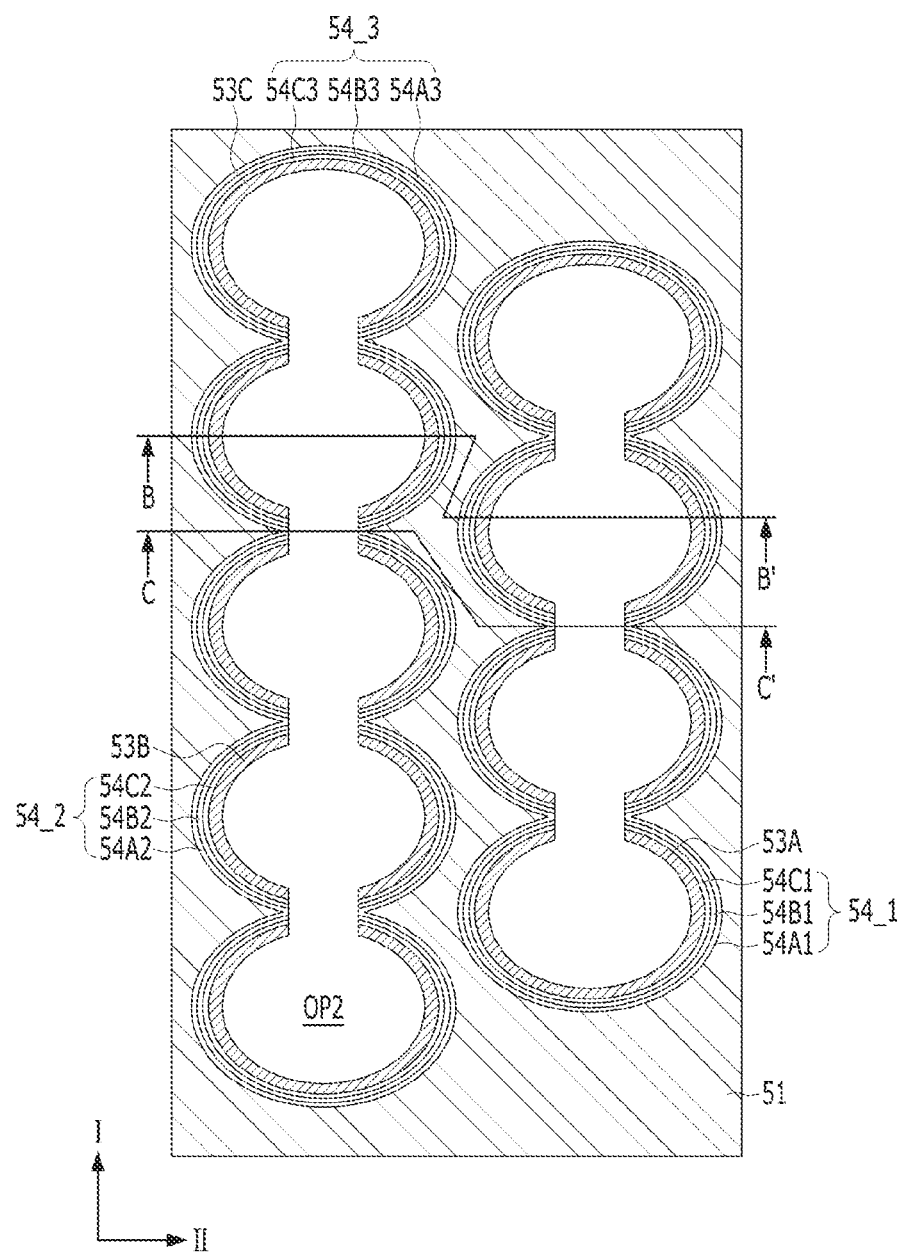
Figure 8B:
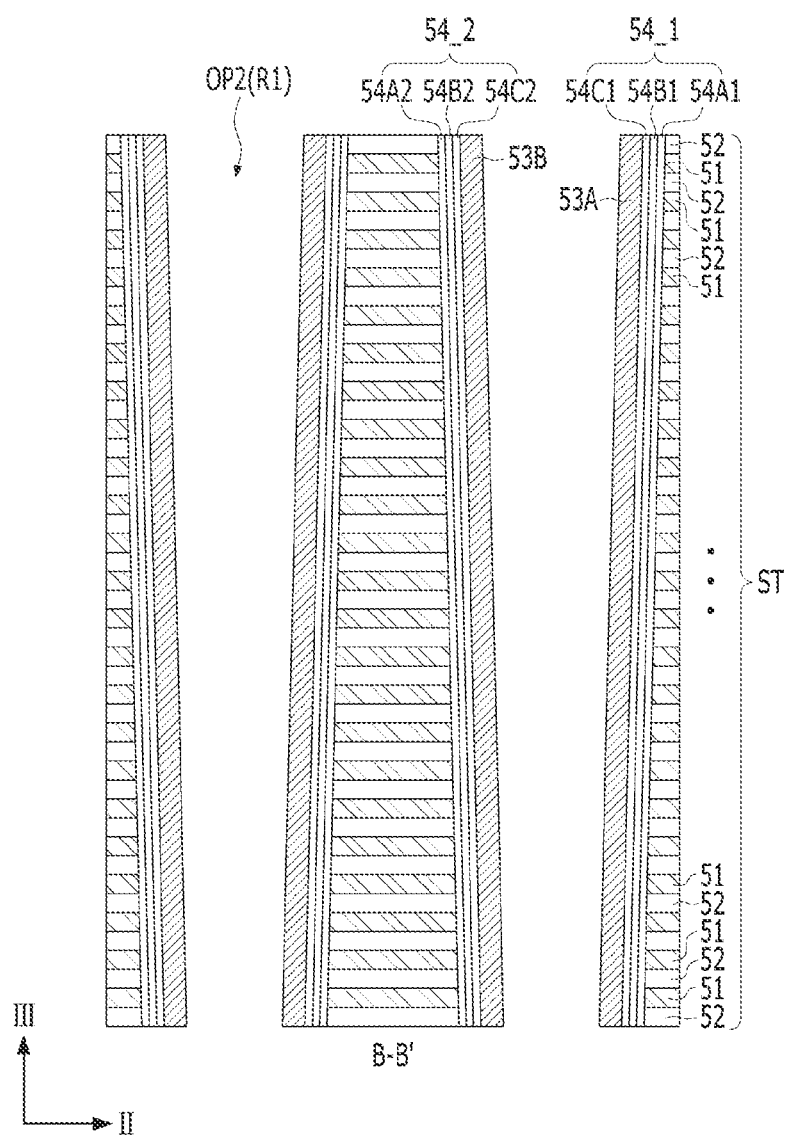
Figure 8C:
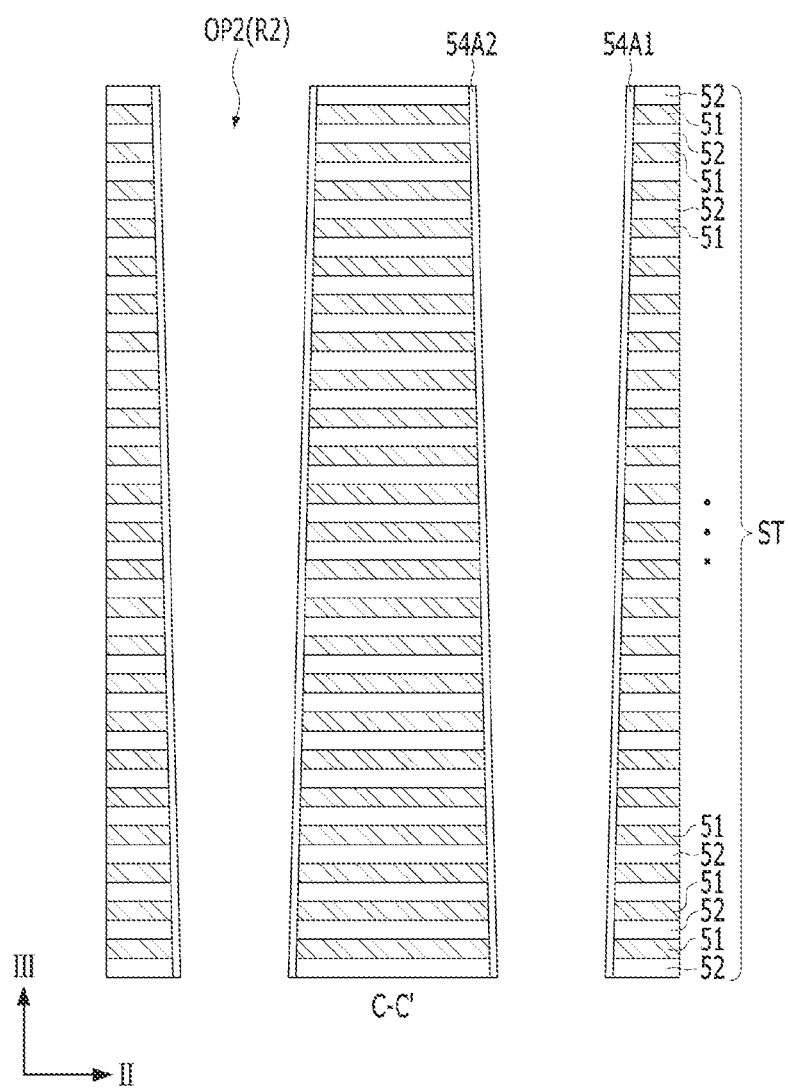

Referring to FIG. 8A to FIG. 8C, channel patterns 53A to 53C may be formed in the second opening OP2. The channel layer 53 may be etched through the second opening OP2. Since the channel layer 53 is of a lesser thickness in the second region R2 than in the first region R1, a portion of the channel layer 53 formed in the second region R2 may be removed during the etching process. A portion of the channel layer 53 formed in the first region R1 may remain and become the channel patterns 53A to 53C. Through this, the channel patterns 53A to 53C located in the first regions R1 and isolated from one another may be formed.

As an example, the channel layer 53 may be etched to form first channel patterns 53A, second channel patterns 53B, and third channel patterns 53C. A pair of first channel pattern 53A and second channel pattern 53B may be located in one first region R1 and may face each other in the first direction I. The third channel pattern 53C may be located at an end of the second opening OP2.

Memory patterns 54_1 to 54_3 may be formed in the second opening OP2. The memory layer 54 may be partially exposed by the channel patterns 53A to 53C, and the memory patterns 54_1 to 54_3 may be formed by etching the exposed portion. A portion of the memory layer 54 formed in the second region R2 may be etched to form the memory patterns 54_1 to 54_3 located in the first regions R1. The memory patterns 54_1 to 54_3 may surround the channel patterns 53A to 53C, respectively. One of the memory patterns 54_1 to 54_3 may surround one of the channel patterns 53A to 53C.

As an example, the memory layer 54 may be etched by using the channel patterns 53A to 53C as etch barriers to form a first memory pattern 54_1, a second memory pattern 54_2, and a third memory pattern 54_3. The first memory pattern 54_1, the second memory pattern 54_2, and the third memory pattern 54_3 may be located in the first regions R1. A pair of first memory pattern 54_1 and second memory pattern 54_2 may be located in one first region R1 and may face each other in the first direction I. The third memory pattern 54_3 may be located at the end of the second opening OP2.

The first memory pattern 54_1 may surround the first channel pattern 53A. The first memory pattern 54_1 may include a blocking pattern 54A1, a data storage pattern 54B1, and a tunneling pattern 54C1. The second memory pattern 54_2 may surround the second channel pattern 53B. The second memory pattern 54_2 may include a blocking pattern 54A2, a data storage pattern 54B2, and a tunneling pattern 54C2. The third memory pattern 54_3 may surround the third channel pattern 53C. The third memory pattern 54_3 may include a blocking pattern 54A3, a data storage pattern 54B3, and a tunneling pattern 54C3.

When the memory layer 54 is a multilayer, only a part of the multilayer may be etched. As an example, the blocking layer 54A might not be etched or may be partially etched, and the blocking layer 54A may remain in the second region R2. The data storage layer 54B and the tunneling layer 54C may be divided into the data storage patterns 54B1 to 54B3 and the tunneling patterns 54C1 to 54C3, respectively, and the blocking layer 54A may be retained.

Figure 9A:
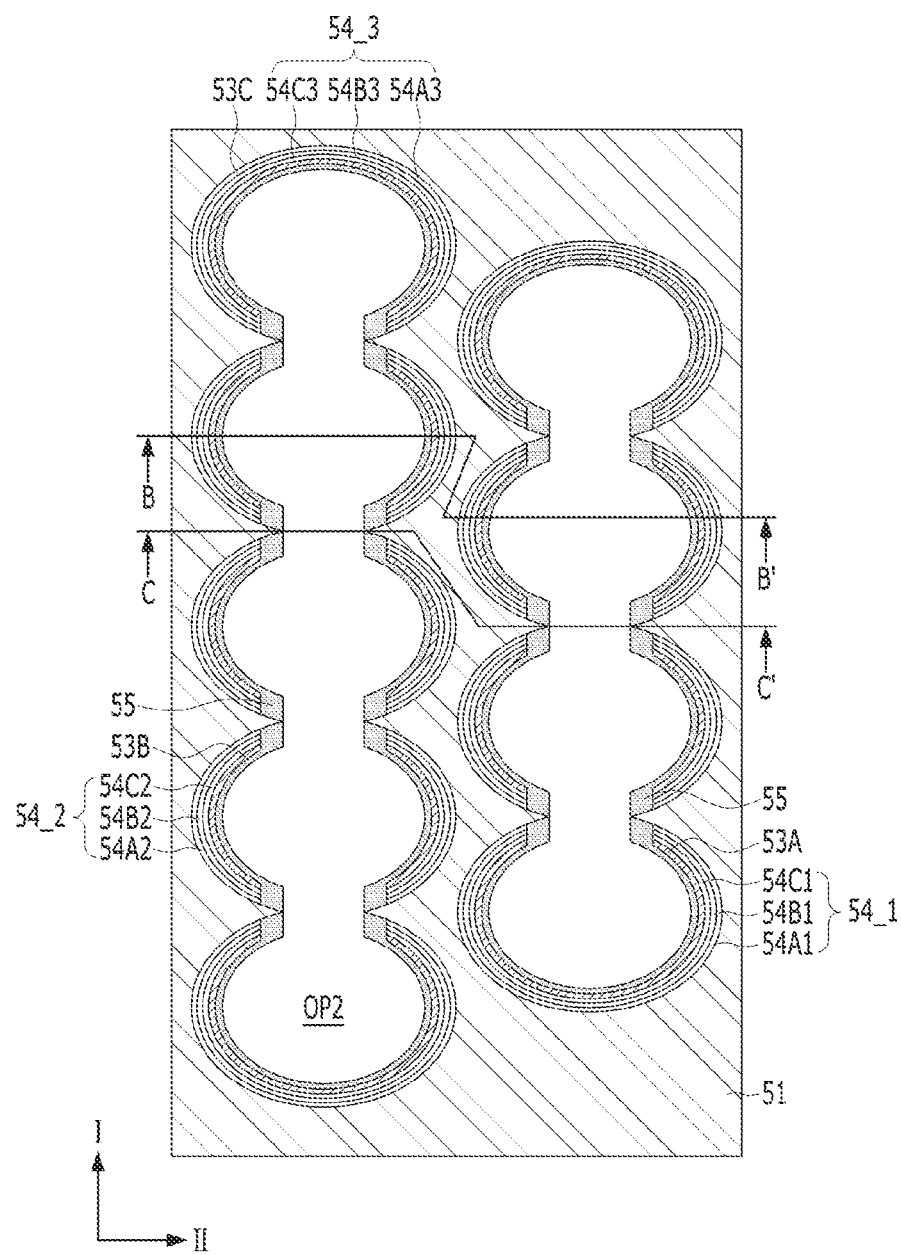
Figure 9B:
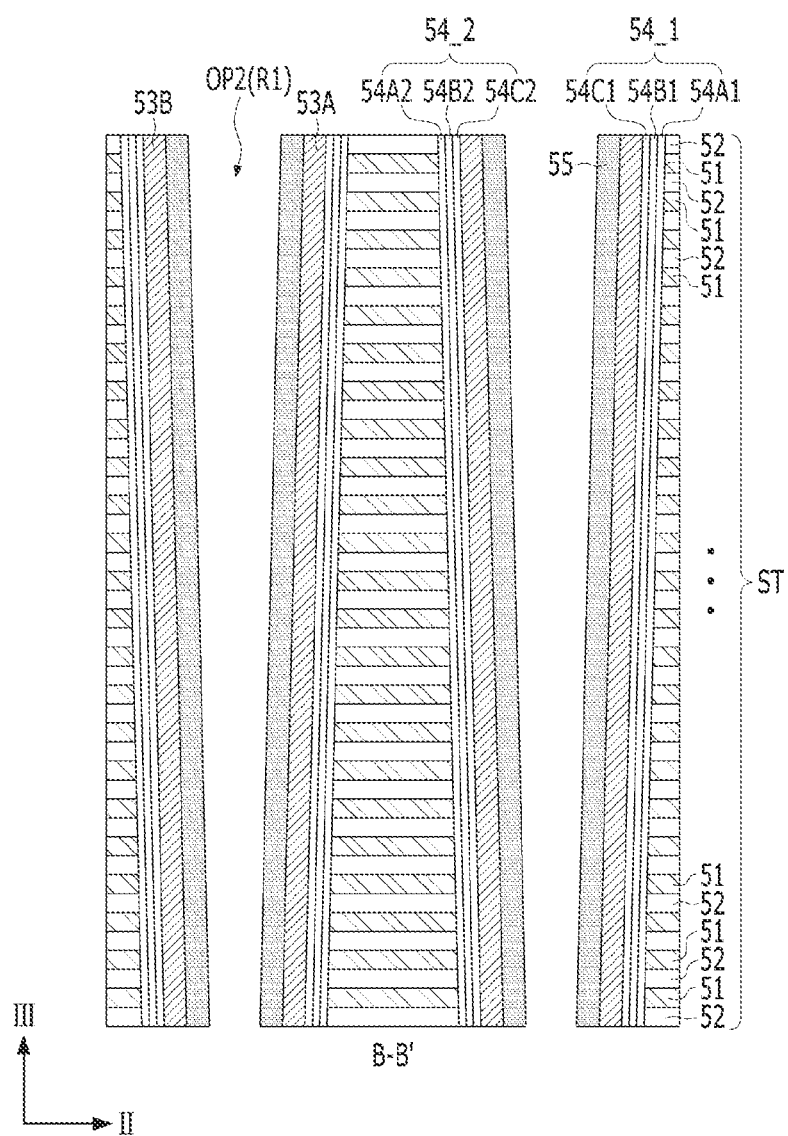
Figure 9C:
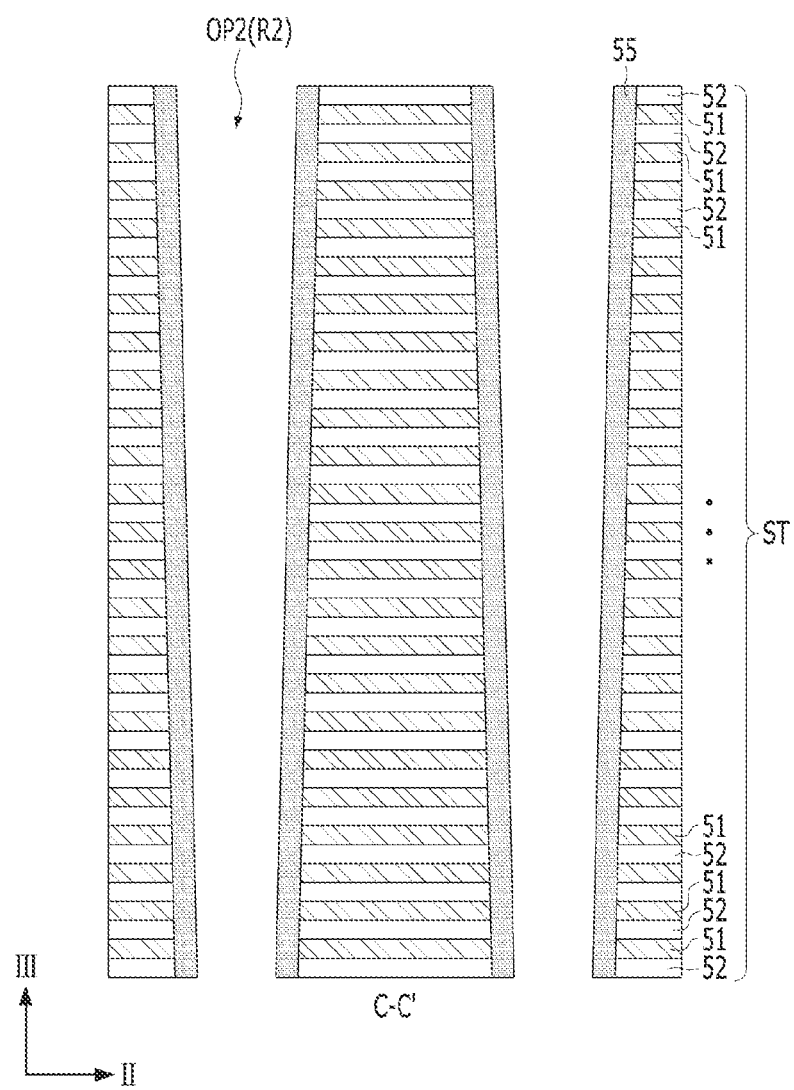

Referring to FIG. 9A to FIG. 9C, a passivation layer 55 may be formed in the second opening OP2. The passivation layer 55 may include a material having an etching selectivity with respect to the first material layers 51. As an example, the first material layers 51 may each include nitride, and the passivation layer 55 may include oxide or polysilicon, or a combination thereof.

The passivation layer 55 may be formed through a deposition process or an oxidation process. As an example, the passivation layer 55 may be formed by oxidizing the memory patterns 54_1 to 54_3 and the channel patterns 53A to 53C exposed through the second opening OP2. The passivation layer 55 may be formed on etched surfaces of the memory patterns 54_1 to 54_3, etched surfaces of the channel patterns 53A to 53C, and inner surfaces of the channel patterns 53A to 53C. The etched surface may be a side wall.

The passivation layer 55 may be formed to have varying thicknesses. As an example, the passivation layer 55 may be formed with a relatively great thickness on the etched surfaces of the memory patterns 54_1 to 54_3 and the etched surfaces of the channel patterns 53A to 53C and may be formed with a relatively small thickness on the inner surfaces of the channel patterns 53A to 53C. A difference in thickness for each region may be caused by the characteristics of the oxidation process. As an example, the etched surfaces may protrude into the second opening OP2 compared to the inner surfaces of the channel patterns 53A to 53C, and radicals may be concentrated on the protruding portion so that the amount of oxidation may be increased.

The channel patterns 53A to 53C and the data storage patterns 54B1 to 54B3 may be oxidized during the oxidation process. The tunneling patterns 54C1 to 54C3 and the blocking patterns 54A1 to 54AC may be oxidized together with the channel patterns 53A to 53C and the data storage patterns 54B1 to 54B3 or may remain in an oxide state.

Figure 10A:
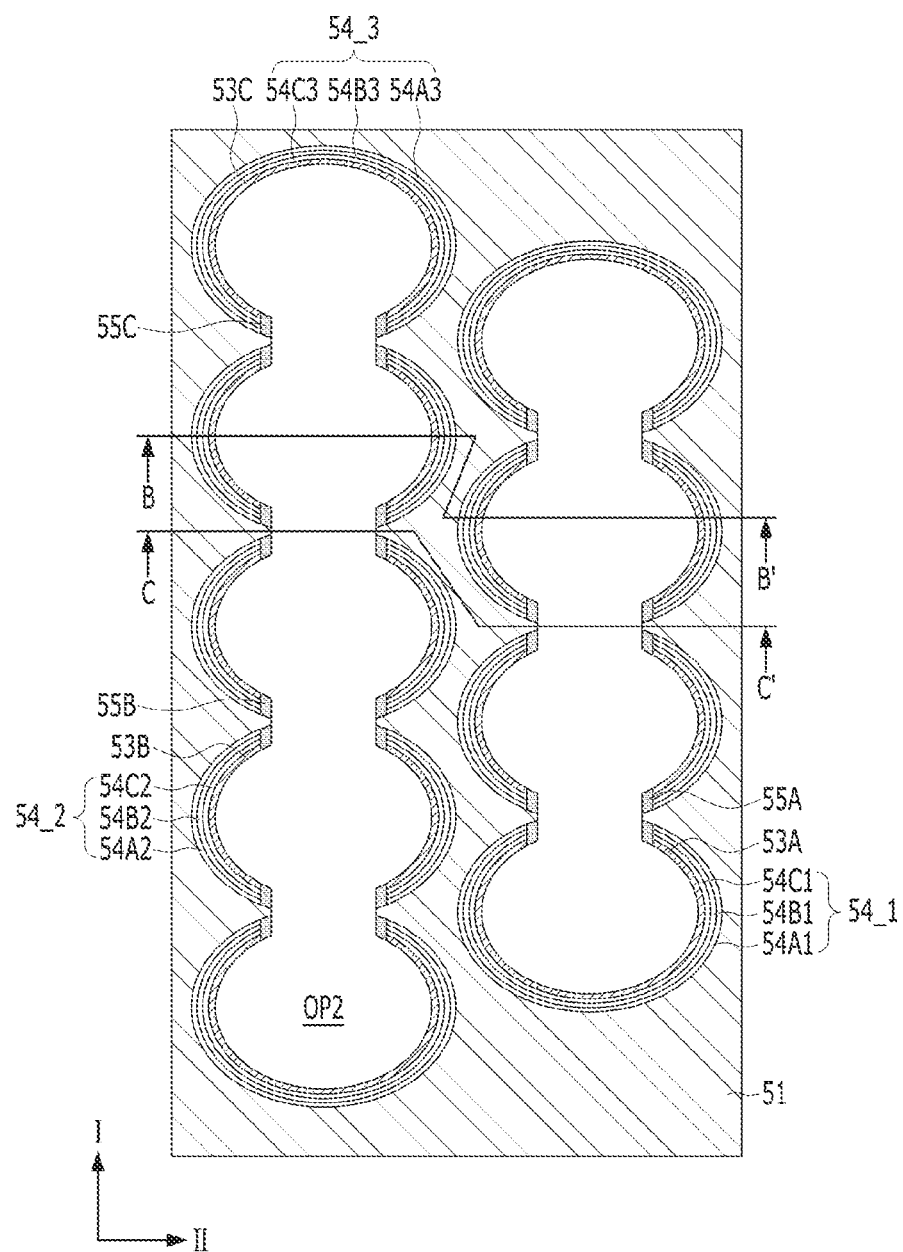
Figure 10B:
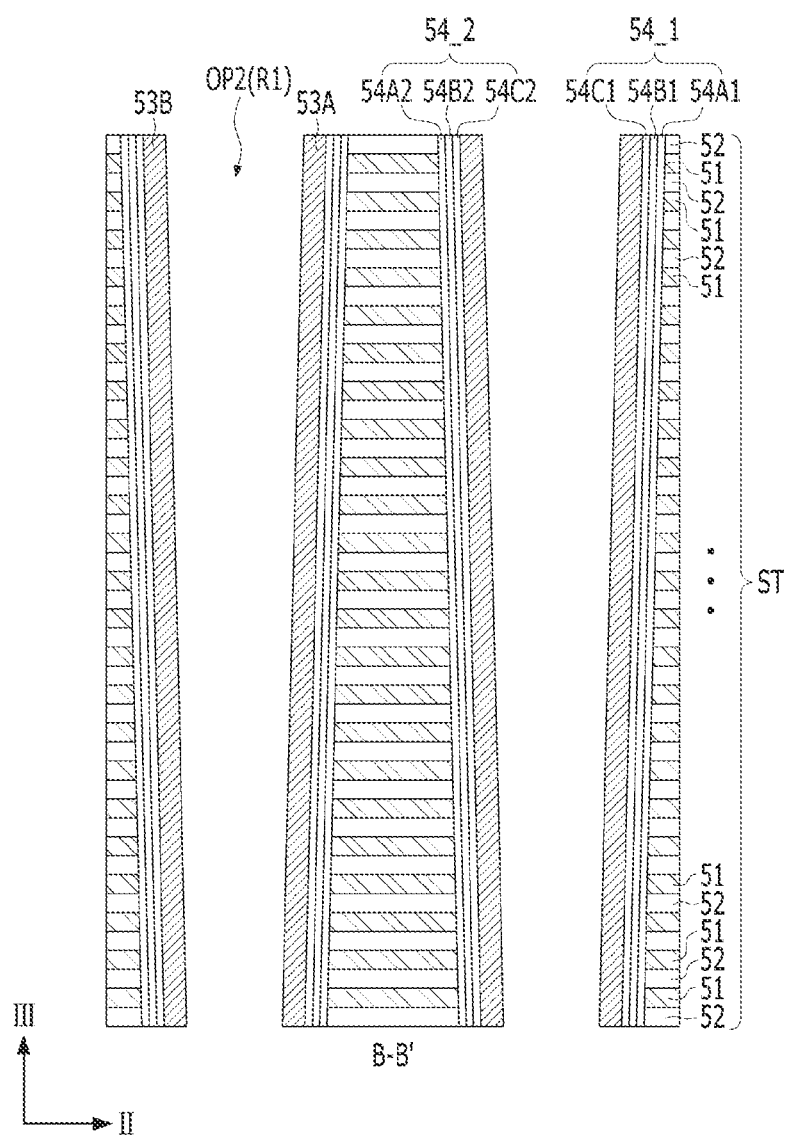
Figure 10C:
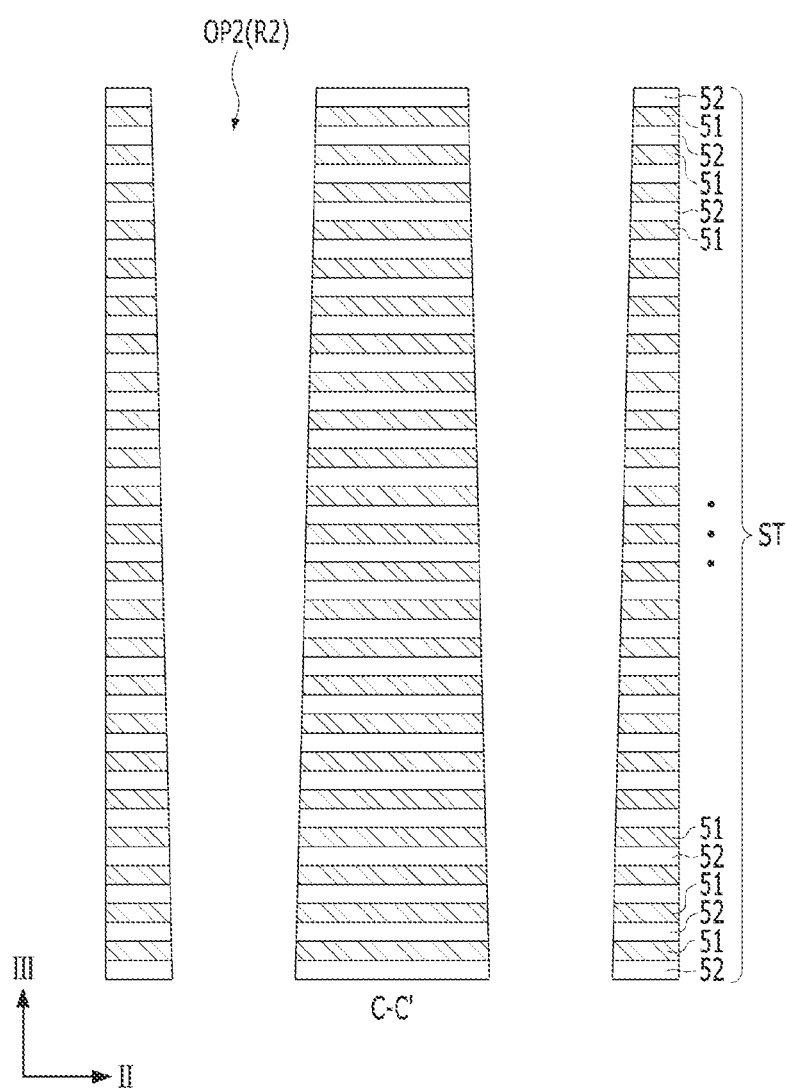

Referring to FIG. 10A to FIG. 10C, passivation patterns 55A to 55C may be formed in the second opening OP2. The passivation layer 55 may be etched to form the passivation patterns 55A to 55C. As an example, the passivation layer 55 may be etched through a wet etching process. Through the etching process, portions of the passivation layer 55 formed on the inner surfaces of the channel patterns 53A to 53C may be removed, and portions formed on the etched surfaces may remain to form the passivation patterns 55A to 55C. A part of the passivation layer 55 may also remain on the inner surfaces of the channel patterns 53A to 53C.

The passivation patterns 55A to 55C may be formed on the etched surfaces of the memory patterns 54_1 to 54_3. The passivation patterns 55A to 55C may extend from the etched surfaces of the memory patterns 54_1 to 54_3 to the etched surfaces of the channel patterns 53A to 53C. First passivation patterns 55A may be formed on the etched surfaces of the first memory pattern 54_1 and the first channel pattern 53A. Second passivation patterns 55B may be formed on the etched surfaces of the second memory pattern 54_2 and the second channel pattern 53B. Third passivation patterns 55C may be formed on the etched surfaces of the third memory pattern 54_3 and the third channel pattern 53C. The first material layers 51 may be exposed between the first passivation patterns 55A. The first material layers 51 may be exposed between the second passivation patterns 55B. The first material layers 51 may be exposed between the first passivation pattern 55A and the third passivation pattern 55C.

Figure 11A:
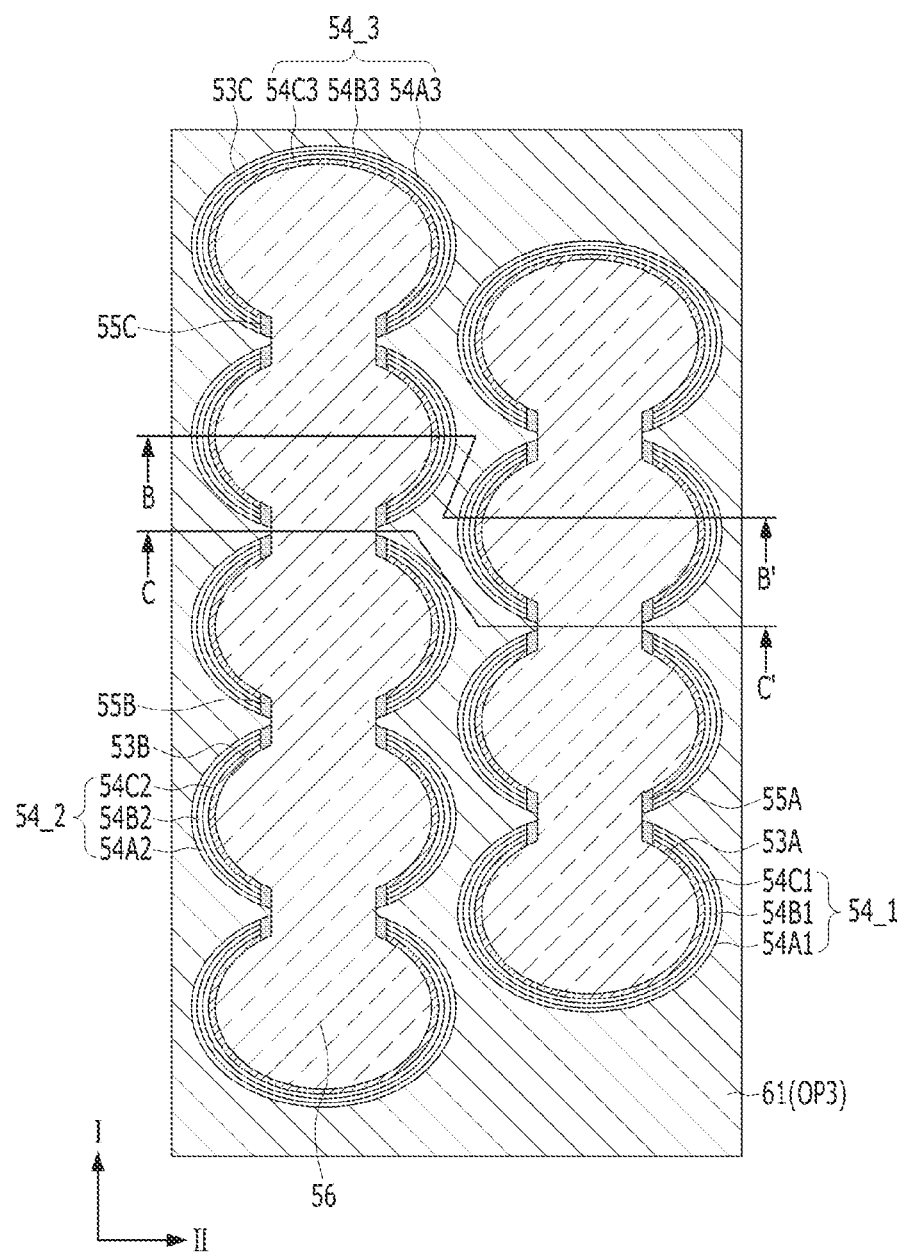
Figure 11B:
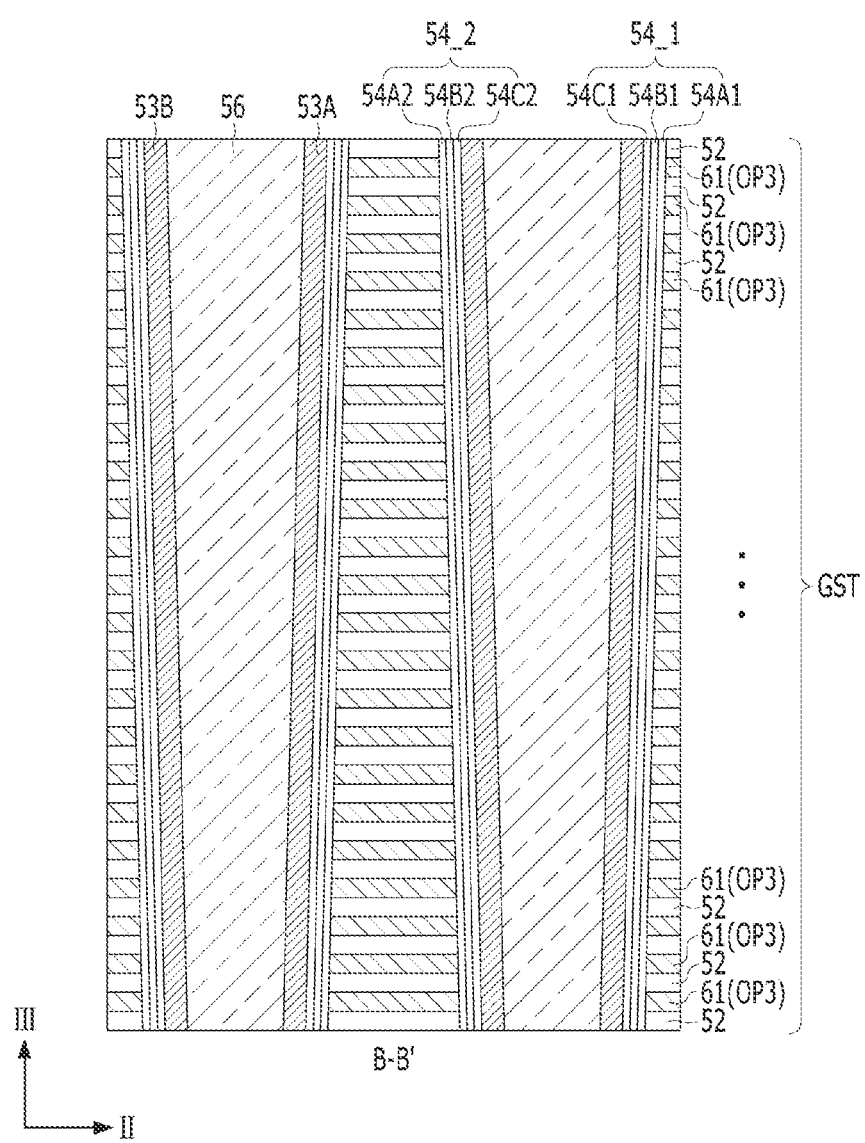
Figure 11C:
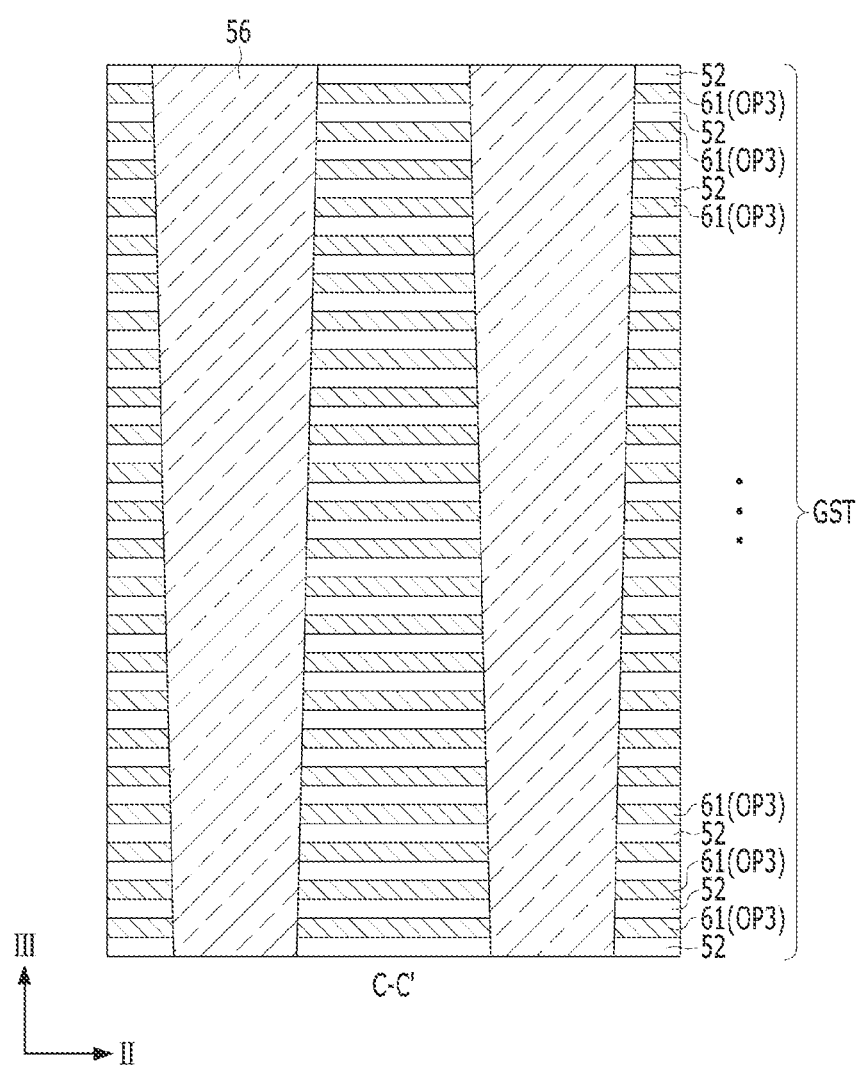

Referring to FIG. 11A to FIG. 11C, the first material layers 51 may be replaced with third material layers 61 through the second opening OP2. As an example, the first material layers 51 exposed between the passivation patterns 55A to 55C may be selectively etched to form the third openings OP3. Subsequently, the third material layers 61 may be formed in the third openings OP3. As an example, a third material may be deposited in the second opening OP2 and the third opening OP3, and the third material deposited in the second opening OP2 may be wet-etched to form the third material layers 61 respectively located in the third openings OP3.

When the third material layers 61 are etched, the first memory pattern 54_1 and the first channel pattern 53A may be protected by the passivation pattern 55A, the second memory pattern 54_2 and the second channel pattern 53B may be protected by the passivation pattern 55B, and the third memory pattern 54_3 and the third channel pattern 53C may be protected by the passivation pattern 55C. As an example, in a case in which each of the third material layers 61 and the data storage patterns 54B1 to 54B3 includes nitride, the data storage patterns 54B1 to 54B3 may be damaged when the third material layers 61 are etched. Accordingly, the data storage patterns 54B1 to 54B3 may be protected by forming the passivation patterns 55A to 55C on the etched surfaces of the first to third memory patterns 54_1 to 54_3.

When each of the first material layers 51 includes a conductive material, a process of replacing the first material layers 51 with the third material layers 61 may be omitted. Alternatively, instead of replacing the first material layers 51 with the third material layers 61, a silicide process may be performed to reduce the resistance of the first material layers 51.

Subsequently, an isolation insulating layer 56 may be formed in the second opening OP2. As an example, the isolation insulating layer 56 may be formed by depositing an insulating material. The isolation insulating layer 56 may include an insulating material, such as oxide, nitride, or air gap.

According to the manufacturing method described above, the channel layer 53 having varying thicknesses may be formed by using the shape of the second opening OP2 and the characteristics of the deposition process. Accordingly, the channel layer 53 may be divided into the channel patterns 53A to 53C through an etching process. By forming the first channel pattern 53A and the second channel pattern 53B in the first region R1, the number of memory strings formed in the first region R1 can be increased. Through this, the degree of integration of the semiconductor device can be improved.

FIG. 12A to FIG. 12E are diagrams for describing a manufacturing method of a semiconductor device in accordance with an embodiment. Hereinafter, the content overlapping with the previously described content will be omitted.

Figure 12A:
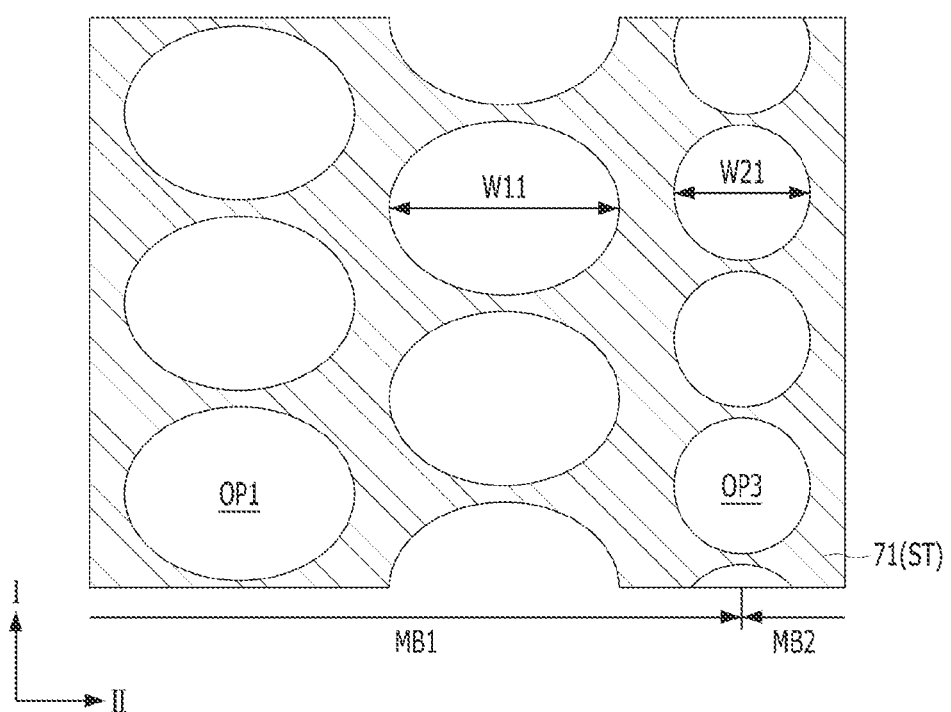
FIG. 12A to 12E are diagrams for describing a method of manufacturing a semiconductor device in accordance with an embodiment.

Referring to FIG. 12A, a stack ST may be formed. The stack ST may include first material layers 71 and second material layers that are alternately stacked. Subsequently, first openings OP1 may be formed in the stack ST. The first openings OP1 may be arranged in the first direction I and spaced apart from each other. The first openings OP1 may be located in memory blocks MB1 and MB2. In a plane defined by the first direction I and the second direction II, the first opening OP1 may have a first width W11 in the second direction II. In the plane, the first openings OP1 may have a circular shape, an elliptical shape, a polygonal shape, or the like.

Third openings OP3 may be formed in the stack ST. The third openings OP3 may be arranged in the first direction I and spaced apart from each other. The third openings OP3 may be located at a boundary between the memory blocks MB1 and MB2. In the plane defined by the first direction I and the second direction II, the third opening OP3 may have a second width W21 in the second direction II. The second width W21 may be substantially equal to or less than the first width W11. In the plane, each of the third openings OP3 may have a circular shape, an elliptical shape, a polygonal shape, or the like.

The third openings OP3 and the first openings OP1 may be adjacent to each other in the second direction II intersecting the first direction I. The third openings OP3 may be formed when the first openings OP1 are formed. The first opening OP1 and the third opening OP3 may have substantially the same shape or different shapes. As an example, each of the first openings OP1 may have an elliptical shape, and each of the third openings OP3 may have a circular shape.

Figure 12B:
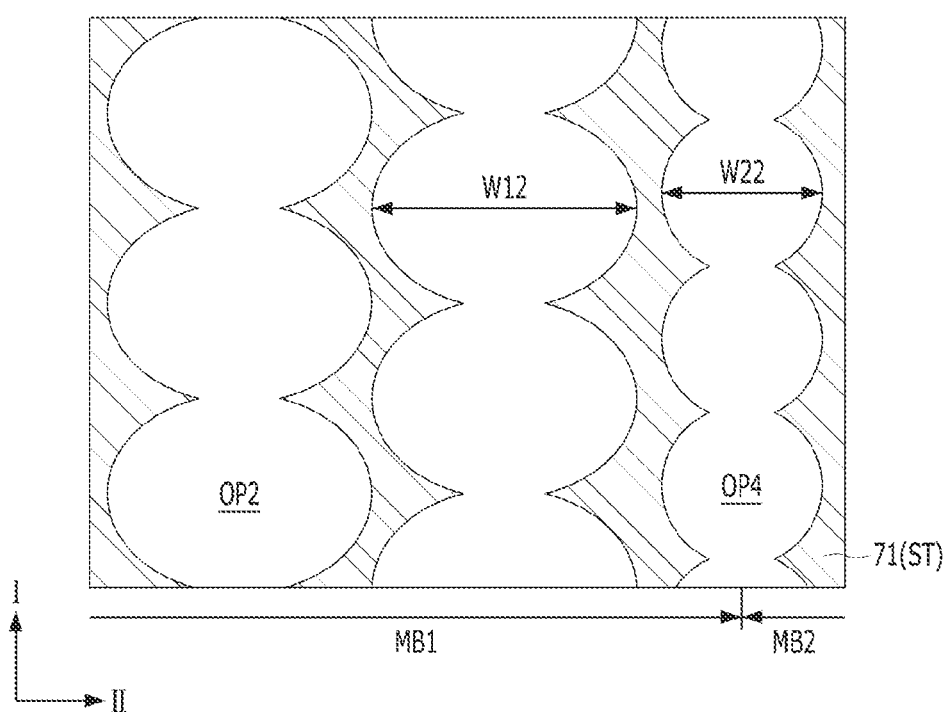

Referring to FIG. 12B, a second opening OP2 connecting the first openings OP1 to each other may be formed by expanding the first openings OP1. The second opening OP2 may extend in the first direction I. As an example, the second opening OP2 may be located in a first memory block MB1. The second opening OP2 may have a larger first width W12 than the first opening OP1. Although not illustrated in the drawing, the second opening OP2 may also be formed in a second memory block MB2.

A fourth opening OP4 connecting the third openings OP3 to each other may be formed by expanding the third openings OP3. The fourth opening OP4 may be formed when the second opening OP2 is formed. The fourth opening OP4 may extend in the first direction I. As an example, the fourth opening OP4 may be located at the boundary between the first memory block MB1 and the second memory block MB2. The stack ST of the first memory block MB1 and the stack ST of the second memory block MB2 may be isolated from each other by the fourth opening OP4. The fourth opening OP4 may have a second width W22 that is substantially the same as or different from that of the third opening OP3. As an example, the second width W22 of the fourth opening OP4 may be less than the first width W12.

Instead of forming and expanding the third openings OP3, the fourth opening OP4 may also be directly formed in the stack ST.

Figure 12C:
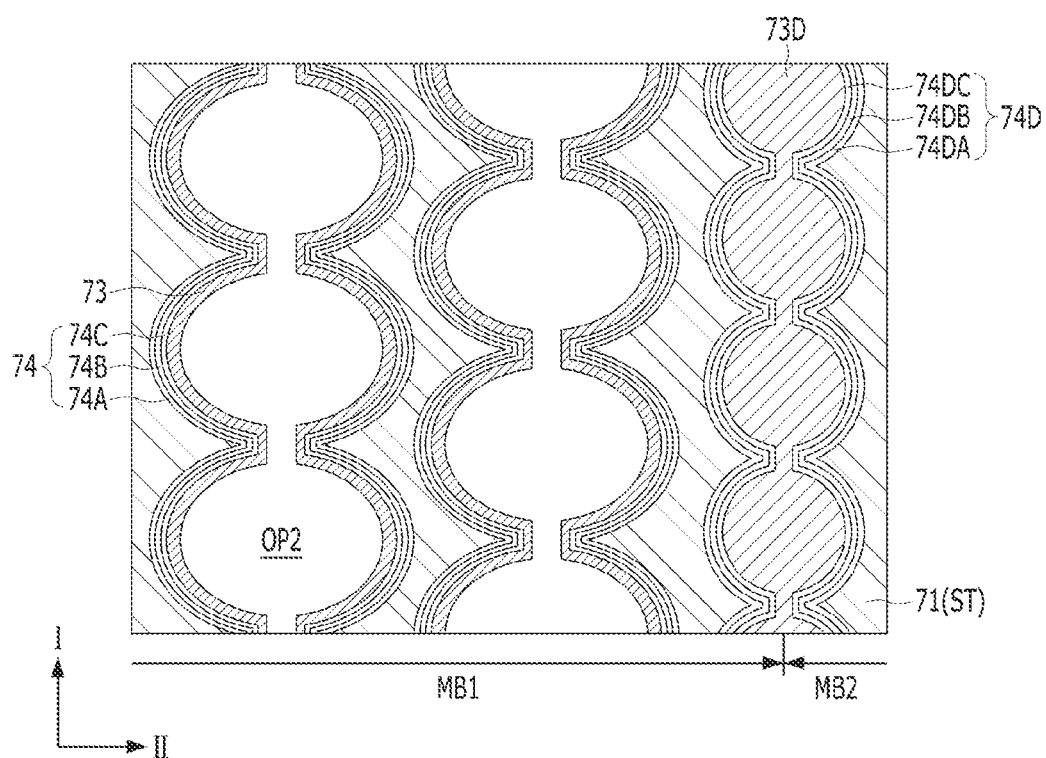

Referring to FIG. 12C, a memory layer 74 may be formed in the second opening OP2. As an example, a blocking layer 74A may be formed in the second opening OP2, a data storage layer 74B may be formed in the blocking layer 74A, and a tunneling layer 74C may be formed in the data storage layer 74B. Subsequently, a channel layer 73 may be formed in the memory layer 74.

A dummy memory layer 74D may be formed in the fourth opening OP4. As an example, a dummy blocking layer 74DA may be formed in the fourth opening OP4, a dummy data storage layer 74 DB may be formed in the dummy blocking layer 74DA, and a dummy tunneling layer 74DC may be formed in the dummy data storage layer 74DB. Subsequently, a dummy channel layer 73D may be formed in the dummy memory layer 74D. The dummy memory layer 74D and the dummy channel layer 73D may be located at the boundary between the first memory block MB1 and the second memory block MB2 and may separate the stack ST of the first memory block MB1 and the stack of the second memory block MB2.

The dummy memory layer 74D may be formed when the memory layer 74 is formed. When the channel layer 73 is formed, the dummy channel layer 73D may be formed. The second opening OP2 may be partially filled with the memory layer 74 and the channel layer 73, and the second opening OP2 may be partially open. The fourth opening OP4 may be filled with the dummy memory layer 74D and the dummy channel layer 73D. As an example, when the fourth opening OP4 is of a lesser width than the second opening OP2, the fourth opening OP4 may be completely filled with the dummy memory layer 74D and the dummy channel layer 73D, and the fourth opening OP4 might not be open.

Figure 12D:
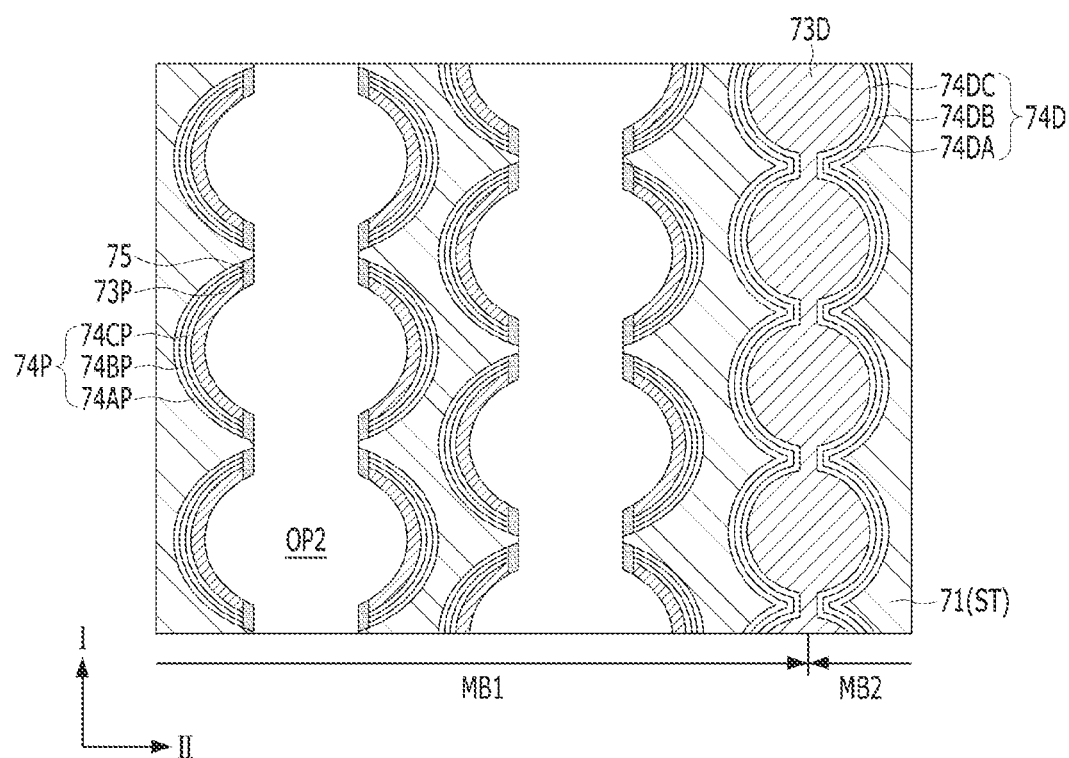
Figure 12E:
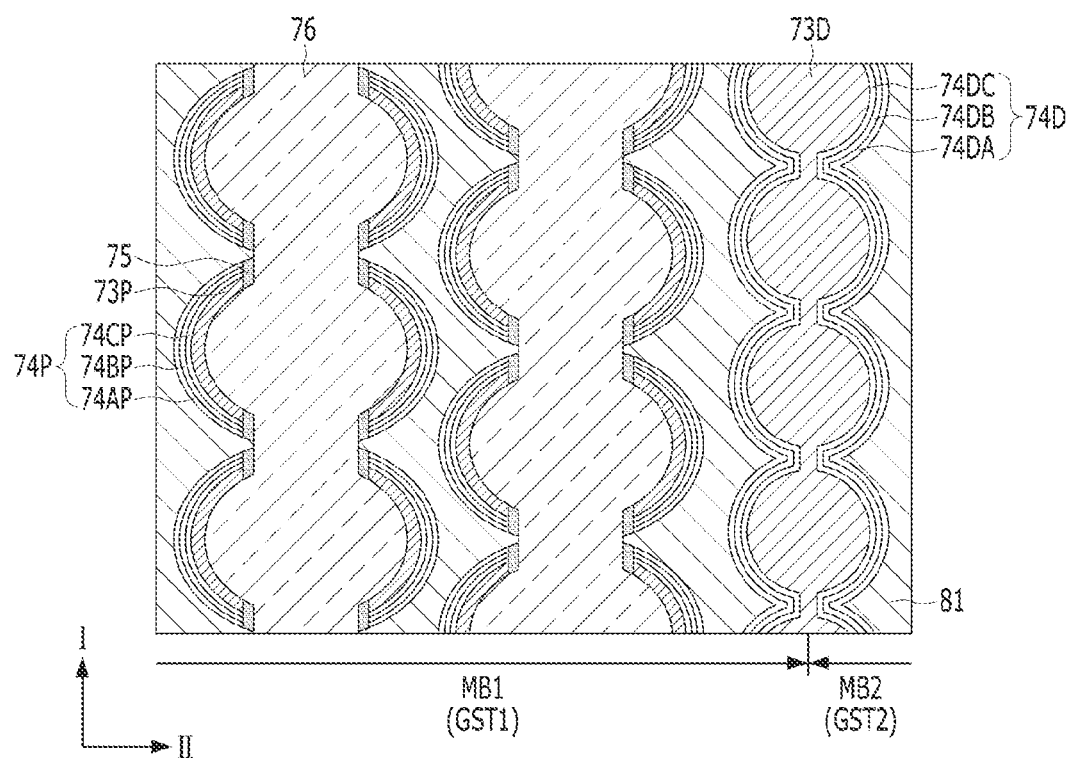

Referring to FIG. 12D, channel patterns 73P may be formed by etching the channel layer 73. The channel layer 73 may be etched through the opened second opening OP2. Subsequently, the memory layer 74 may be etched to form memory patterns 74P. The memory pattern 74P may include a blocking pattern 74AP, a data storage pattern 74BP, and a tunneling pattern 74CP. The blocking layer 74A might not be etched or may be partially etched.

When the channel layer 73 is etched, the dummy channel layer 73D may be at least partially etched or might not be etched. When the memory layer 74 is etched, the dummy memory layer 74D may be at least partially etched or might not be etched. As an example, when the fourth opening OP4 is filled with the dummy memory layer 74D and the dummy channel layer 73D and is not open, the dummy channel layer 73D may be retained without being etched when the channel layer 73 is etched. The dummy memory layer 74D may be retained without being etched when the memory layer 74 is etched.

Subsequently, passivation patterns 75 may be formed. As an example, after a passivation layer is formed by oxidizing the memory patterns 74P and the channel patterns 73P, passivation patterns 75P may be formed by etching the passivation layer. When the passivation layer and the passivation patterns 75P are formed, the passivation layer and the passivation patterns might not be formed in the fourth opening OP4. As an example, when the fourth opening OP4 is filled with the dummy memory layer 74D and the dummy channel layer 73D and is not open, the passivation layer and the passivation patterns might not be formed in the fourth opening OP4.

Referring to 12E, the first material layers 71 may be replaced with third material layers 81 through the second opening OP2. Through this, a first gate structure GST1 of the first memory block MB1 and a second gate structure GST2 of the second memory block MB2 may be formed. The first gate structure GST1 and the second gate structure GST2 may be isolated from each other by the dummy memory layer 74D and the dummy channel layer 73D.

Subsequently, an isolation insulating layer 76 may be formed in the second opening OP2. When the isolation insulating layer 76 is formed, the isolation insulating layer 76 may be formed or might not be formed in the fourth opening OP4. As an example, when the fourth opening OP4 is filled with the dummy memory layer 74D and the dummy channel layer 73D and is not open, the isolation insulating layer might not be formed in the fourth opening OP4.

According to the manufacturing method described above, the fourth opening OP4 may be formed by using the process of forming the second opening OP2. The dummy memory layer 74D and the dummy channel layer 73D may be formed by using the process of forming the memory layer 74 and the channel layer 73. The dummy memory layer 74D and the dummy channel layer 73D may be used as an isolation structure for isolating the memory blocks MB1 and MB2 from each other.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A semiconductor device comprising:
a first gate structure including a plurality of first conductive layers and a plurality of first insulating layers that are alternately stacked;
an isolation insulating layer located in the first gate structure, the isolation insulating layer including a first line portion extending in a first direction, a plurality of first protrusions protruding from the first line portion in a second direction, and a plurality of second protrusions protruding from the first line portion in an opposite direction to the first protrusions, wherein the second direction intersects the first direction;
a plurality of first memory patterns, wherein one of the plurality of first memory patterns surrounds one of the plurality of first protrusions; and
a plurality of first passivation patterns, wherein one of the plurality of first passivation patterns is located between the first line portion and one of the plurality of first memory patterns.

2. The semiconductor device of claim 1, wherein one of the plurality of first conductive layers protrudes between the plurality of first memory patterns and extends between the plurality of first passivation patterns.

3. The semiconductor device of claim 1, further comprising:
a plurality of first channel patterns, wherein one of the plurality of first channel patterns surrounds one of the plurality of first protrusions, one of the plurality of first channel patterns being located between one of the plurality of first protrusion and one of the plurality of first memory patterns.

4. The semiconductor device of claim 3, wherein one of the plurality of first passivation patterns extends between the first line portion and one of the plurality of first channel patterns.

5. The semiconductor device of claim 1, further comprising:
a plurality of second memory patterns, wherein one of the plurality of second memory patterns surrounds one of the plurality of second protrusions; and
a plurality of second passivation patterns, wherein one of the plurality of second passivation patterns is located between the first line portion and one of the plurality of second memory patterns.

6. The semiconductor device of claim 5, wherein one of the plurality of first conductive layers protrudes between the plurality of second memory patterns and extends between the plurality of second passivation patterns.

7. The semiconductor device of claim 5, further comprising:
a plurality of second channel patterns, wherein one of the plurality of second channel patterns surrounds one of the plurality of second protrusions, one of the plurality of second channel patterns being located between one of the plurality of second protrusion and one of the plurality of second memory patterns.

8. The semiconductor device of claim 7, wherein one of the plurality of second passivation patterns extends between the first line portion and one of the plurality of second channel patterns.

9. The semiconductor device of claim 1, further comprising:
a third memory pattern surrounding an end portion of the first line portion; and
a third channel pattern located between the isolation insulating layer and the third memory pattern.

10. The semiconductor device of claim 9, wherein the third memory pattern extends to surround a first protrusion, among the plurality of first protrusions, and a second protrusion, among the plurality of second protrusions, which are adjacent to the end portion of the first line portion.

11. The semiconductor device of claim 1, further comprising:
a second gate structure including a plurality of second conductive layers and a plurality of second insulating layers that are alternately stacked; and
an isolation structure located between the first gate structure and the second gate structure, the isolation structure including a dummy channel layer and a dummy memory layer surrounding the dummy channel layer.

12. The semiconductor device of claim 11, wherein the dummy channel layer comprises:
a second line portion located between the first gate structure and the second gate structure;
a first protruding pattern protruding from the second line portion into the first gate structure; and
a second protruding pattern protruding from the second line portion into the second gate structure.

* * * * *